United States Patent
Mori

(10) Patent No.: US 11,264,971 B2
(45) Date of Patent: Mar. 1, 2022

(54) MULTIPLEXER, RADIO FREQUENCY CIRCUIT, AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 300 days.

(21) Appl. No.: 16/683,768

(22) Filed: Nov. 14, 2019

(65) Prior Publication Data

US 2020/0153413 A1 May 14, 2020

Related U.S. Application Data

(63) Continuation of application No. PCT/JP2018/015138, filed on Apr. 10, 2018.

(30) Foreign Application Priority Data

May 18, 2017 (JP) .............................. JP2017-098874

(51) Int. Cl.
*H03H 9/70* (2006.01)
*H03H 7/46* (2006.01)
(Continued)

(52) U.S. Cl.
CPC ................ *H03H 9/70* (2013.01); *H03H 7/46* (2013.01); *H03H 9/605* (2013.01);
(Continued)

(58) Field of Classification Search
CPC .... H03H 9/605; H03H 9/6403; H03H 9/6423; H03H 9/6483; H03H 9/70; H03H 9/706;
(Continued)

(56) References Cited

U.S. PATENT DOCUMENTS

| 6,472,953 B1 | 10/2002 | Sakuragawa et al. |
| 6,950,410 B1 | 9/2005 | Brandt |

(Continued)

FOREIGN PATENT DOCUMENTS

| JP | 2000-323961 A | 11/2000 |
| JP | 2004-504759 A | 2/2004 |

(Continued)

OTHER PUBLICATIONS

International Search Report for International Application No. PCT/JP2018/015138 dated Jun. 26, 2018.

(Continued)

*Primary Examiner* — Barbara Summons
(74) *Attorney, Agent, or Firm* — Pearne & Gordon LLP

(57) ABSTRACT

A multiplexer includes a filter (10) arranged between a common terminal and an input/output terminal (110) and configured to pass a radio frequency signal in a first frequency band, and a filter (20) arranged between the common terminal and an input/output terminal (120) and configured to pass a radio frequency signal in a second frequency band. The filter includes series arm circuits (31 and 32) connected in series, a series arm circuit (33) connected in parallel to the series arm circuit (32), and a parallel arm circuit. The series arm circuit (32) includes a series arm resonator that is an acoustic wave resonator. The series arm circuit (33) includes a switch arranged on a second path connecting nodes. In a CA mode, the switch is OFF. In a non-CA mode, the switch is ON.

16 Claims, 25 Drawing Sheets

(51) Int. Cl.
*H03H 9/64* (2006.01)
*H03H 9/72* (2006.01)
*H04B 1/00* (2006.01)
*H04B 1/52* (2015.01)
*H04B 7/08* (2006.01)
*H04W 40/02* (2009.01)
*H03H 9/60* (2006.01)

(52) U.S. Cl.
CPC ........ *H03H 9/6403* (2013.01); *H03H 9/6423* (2013.01); *H03H 9/6483* (2013.01); *H03H 9/706* (2013.01); *H03H 9/72* (2013.01); *H03H 9/725* (2013.01); *H04B 1/0057* (2013.01); *H04B 1/52* (2013.01); *H04B 7/08* (2013.01); *H04W 40/02* (2013.01)

(58) Field of Classification Search
CPC ............ H03H 9/72; H03H 9/725; H03H 7/46; H03H 2210/036; H04B 1/0057; H04B 1/52; H04B 7/08; H04W 40/02
USPC ......................................................... 333/133
See application file for complete search history.

(56) References Cited

U.S. PATENT DOCUMENTS

| | | | | |
|---|---|---|---|---|
| 7,038,557 | B2 * | 5/2006 | Nakamura | H04B 1/0057 333/132 |
| 9,118,376 | B2 * | 8/2015 | Khlat | H04B 1/10 |
| 9,231,552 | B2 * | 1/2016 | Taniuchi | H04B 1/18 |
| 9,966,927 | B2 * | 5/2018 | Khlat | H03H 9/706 |
| 10,128,872 | B2 * | 11/2018 | Langer | H04W 72/0453 |
| 10,187,109 | B2 * | 1/2019 | Saji | H04B 1/006 |
| 2011/0299432 | A1 | 12/2011 | Caron et al. | |
| 2012/0063368 | A1 | 3/2012 | Boyle | |
| 2012/0313731 | A1 | 12/2012 | Burgener et al. | |
| 2013/0214862 | A1 | 8/2013 | Presti | |
| 2015/0295596 | A1 * | 10/2015 | Wloczysiak | H04L 5/08 370/297 |
| 2016/0127015 | A1 | 5/2016 | Wloczysiak et al. | |
| 2017/0264268 | A1 | 9/2017 | Schimidhammer | |
| 2018/0226948 | A1 * | 8/2018 | Sung | H03H 9/706 |
| 2019/0214959 | A1 * | 7/2019 | Nosaka | H04B 1/52 |
| 2020/0083865 | A1 * | 3/2020 | Mori | H03H 9/70 |
| 2021/0075450 | A1 * | 3/2021 | Tsuda | H04B 1/0064 |

FOREIGN PATENT DOCUMENTS

| | | |
|---|---|---|
| JP | 2012-519445 A | 8/2012 |
| JP | 2014-502803 A | 2/2014 |
| JP | 5859685 B2 | 2/2016 |
| JP | 2017-001770 A | 1/2017 |
| WO | 2016/026634 A1 | 2/2016 |

OTHER PUBLICATIONS

Written Opinion for International Application No. PCT/JP2018/015138 dated Jun. 26, 2018.

* cited by examiner

FOR SIMULTANEOUS USE, 2440 TO 2500 MHz IS USED

MULTIPLEXER, RADIO FREQUENCY CIRCUIT, AND COMMUNICATION DEVICE

This is a continuation of International Application No. PCT/JP2018/015138 filed on Apr. 10, 2018 which claims priority from Japanese Patent Application No. 2017-098874 filed on May 18, 2017. The contents of these applications are incorporated herein by reference in their entireties.

BACKGROUND

Technical Field

The present disclosure relates to a multiplexer, a radio frequency circuit, and a communication device.

Recent mobile phones are required to support a plurality of frequencies and a plurality of radio systems with one terminal (tendency toward multiple bands and multiple modes). A multiplexer configured to selectively pass a plurality of transmission/reception signals without necessarily a decrease in quality is arranged at the front end of a mobile phone that responds to the tendency toward multiple bands and multiple modes. There is particularly a demand for a multiplexer that supports so-called carrier aggregation (hereinafter referred to as CA), in which radio frequency signals in a plurality of bands are transmitted or received simultaneously.

Patent Document 1 (FIG. 13) discloses a diversity receiver module to be used in CA or non-CA for LB (Low Band), MB (Middle Band), and HB (High Band) radio frequency signals by switching of a 2P8T switch. In the diversity receiver module, the 2P8T switch is arranged in a preceding stage of filters corresponding to the respective bands, thereby constructing a multiplexer capable of exclusively selecting one band out of the LBs and exclusively selecting one band out of the MBs/HBs.

Patent Document 1: U.S. Patent Application Publication No. 2016/0127015

BRIEF SUMMARY

In the diversity receiver module disclosed in Patent Document 1, the 2P8T switch is arranged in the preceding stage of all the filters. Therefore, paths in which all the radio frequency signals pass constantly involve passage through the 2P8T switch irrespective of CA or non-CA. Even in the non-CA mode, a propagation loss resulting from addition of a propagation loss due to an ON resistance of the 2P8T switch to a propagation loss of a filter corresponding to the selected band is added to the radio frequency signal in the band. Further, in order to support both the CA mode and the non-CA mode, attenuation characteristics of the respective filters are designed so that bandpass characteristics of other filters are not deteriorated. Therefore, a circuit structure necessary to secure the attenuation characteristics is added constantly. Thus, a propagation loss due to the circuit structure necessary to secure the attenuation characteristics is added constantly.

That is, a problem arises in that the propagation loss due to the switch and the propagation loss due to the circuit structure necessary to secure the attenuation characteristics constantly occur irrespective of the CA mode or the non-CA mode.

The non-CA means that only a radio frequency signal in one frequency band (band) is passed among radio frequency signals in a plurality of different frequency bands instead of simultaneously transmitting or receiving the radio frequency signals in the plurality of bands.

The present disclosure provides a multiplexer, a radio frequency circuit, and a communication device in which propagation losses of radio frequency signals are reduced in a CA mode and a non-CA mode.

A multiplexer according to one aspect of the present disclosure includes a common terminal, a first input/output terminal, a second input/output terminal, a first filter arranged between the common terminal and the first input/output terminal and configured to pass a radio frequency signal in a first frequency band allocated as a pass band, and a second filter arranged between the common terminal and the second input/output terminal and configured to pass a radio frequency signal in a second frequency band allocated as a pass band. The first filter includes a first series arm circuit and a second series arm circuit arranged between the common terminal and the first input/output terminal and connected in series, a third series arm circuit connected in parallel to the second series arm circuit, and a first parallel arm circuit connected to a ground and to a node on a first path connecting the common terminal and the first input/output terminal. The second series arm circuit includes a first series arm resonator that is an acoustic wave resonator having an input terminal and an output terminal connected on the first path. The third series arm circuit includes a first switch having an input terminal and an output terminal connected on a second path connecting two connection points where the second series arm circuit and the third series arm circuit are connected in parallel. When the radio frequency signals in the first frequency band and the second frequency band are passed simultaneously, the first switch is in a non-conductive state. When only the radio frequency signal in the first frequency band out of the first frequency band and the second frequency band is passed, the first switch is in a conductive state.

When the radio frequency signals in the first frequency band and the second frequency band are passed simultaneously (CA mode), the radio frequency signal in the first frequency band passes through the first filter without necessarily passing through the first switch. Therefore, a switch loss of the first filter can be reduced. When only the radio frequency signal in the first frequency band out of the first frequency band and the second frequency band is passed, the second series arm circuit is bypassed by conduction of the first switch. Thus, a radio frequency propagation loss in a main path of the first filter can be reduced. Accordingly, the radio frequency propagation loss can be reduced while reducing the switch loss of the multiplexer.

When the first switch is in the non-conductive state, an anti-resonant frequency of a parallel combination circuit of the second series arm circuit and the third series arm circuit may be located within the second frequency band.

Thus, when the radio frequency signals in the first frequency band and the second frequency band are passed simultaneously (CA mode), attenuation of the first filter in the second frequency band can be secured greatly. Accordingly, an in-band insertion loss of the second filter can be reduced.

A resonant frequency of the parallel combination circuit of the second series arm circuit and the third series arm circuit may be higher than a resonant frequency of the first series arm circuit and may be higher than a higher frequency end of the first frequency band.

According to the structure described above, the pass band of the first filter is defined by the first series arm circuit and the first parallel arm circuit and the resonant frequency of the parallel combination circuit is located outside the pass band of the first filter, thereby being capable of reducing the occurrence of an insertion loss ripple in this pass band due to the parallel combination circuit. Thus, the radio frequency propagation loss of the first filter can further be reduced.

The third series arm circuit may further include an impedance element arranged on the second path and connected in series to the first switch.

Thus, improvement is observed in terms of impedance mismatching in the first path where the second series arm circuit is bypassed because the first switch is brought into the conductive state. Accordingly, improvement is observed in terms of an insertion loss in the pass band of the first filter.

The first filter may further include a second parallel arm circuit connected to the ground and to a node on the first path. The second parallel arm circuit may include a first parallel arm resonator that is an acoustic wave resonator connected between the node and the ground, and a second switch connected between the first parallel arm resonator and the ground. When the radio frequency signals in the first frequency band and the second frequency band are passed simultaneously, the second switch may be in a conductive state. When only the radio frequency signal in the first frequency band out of the first frequency band and the second frequency band is passed, the second switch may be in a non-conductive state.

When the radio frequency signals in the first frequency band and the second frequency band are passed simultaneously (CA mode), the second parallel arm circuit is caused to function by conduction of the second switch in the first filter. Therefore, an attenuation characteristic in the vicinity of the pass band can be enhanced. When only the radio frequency signal in the first frequency band out of the first frequency band and the second frequency band is passed, a combined admittance of the second parallel arm circuit in the pass band is reduced by bringing the second switch into non-conduction. Therefore, the insertion loss in the pass band of the first filter can be reduced.

When the second switch is in the non-conductive state, a resonant frequency of the second parallel arm circuit may be higher than the higher frequency end of the first frequency band.

Accordingly, when only the radio frequency signal in the first frequency band out of the first frequency band and the second frequency band is passed (non-CA mode), the resonant frequency of the second parallel arm circuit is located outside the pass band of the first filter, thereby being capable of reducing the occurrence of an insertion loss ripple in this pass band due to the second parallel arm circuit. Thus, the radio frequency propagation loss of the first filter can further be reduced.

The second parallel arm circuit may further include an inductance element connected to the first parallel arm resonator.

Accordingly, it is possible to reduce the occurrence of the insertion loss ripple due to the second parallel arm circuit. Thus, the radio frequency propagation loss of the first filter can further be reduced.

A multiplexer according to one aspect of the present disclosure includes a common terminal, a first input/output terminal, a second input/output terminal, a first filter arranged between the common terminal and the first input/output terminal and configured to selectively pass a radio frequency signal in a first frequency band allocated as a pass band, and a second filter arranged between the common terminal and the second input/output terminal and configured to selectively pass a radio frequency signal in a second frequency band allocated as a pass band. The first filter includes a first series arm circuit connected between the common terminal and the first input/output terminal, a first parallel arm circuit connected to a ground and to a first node on a first path connecting the common terminal and the first input/output terminal, and a second parallel arm circuit connected to the ground and to a second node on the first path. The second parallel arm circuit includes a first parallel arm resonator that is an acoustic wave resonator connected between the second node and the ground, and a second switch connected between the first parallel arm resonator and the ground. When the radio frequency signals in the first frequency band and the second frequency band are passed simultaneously, the second switch is in a conductive state. When only the radio frequency signal in the first frequency band out of the first frequency band and the second frequency band is passed, the second switch is in a non-conductive state.

When the radio frequency signals in the first frequency band and the second frequency band are passed simultaneously (CA mode), the second parallel arm circuit is caused to function by conduction of the second switch in the first filter. Therefore, the attenuation characteristic in the vicinity of the pass band can be enhanced without necessarily causing a radio frequency propagation loss in the first path due to the conduction of the second switch. When only the radio frequency signal in the first frequency band out of the first frequency band and the second frequency band is passed, the combined admittance of the second parallel arm circuit in the pass band is reduced by bringing the second switch into non-conduction. Therefore, the insertion loss in the pass band of the first filter can be reduced without necessarily causing a radio frequency propagation loss in the first path due to the non-conduction of the second switch. Thus, the radio frequency propagation loss can be reduced while reducing the switch loss of the multiplexer.

When the second switch is in the non-conductive state, a resonant frequency of the second parallel arm circuit may be higher than a higher frequency end of the first frequency band.

Accordingly, when only the radio frequency signal in the first frequency band out of the first frequency band and the second frequency band is passed (non-CA mode), the resonant frequency of the second parallel arm circuit is located outside the pass band of the first filter, thereby being capable of reducing the occurrence of the insertion loss ripple in this pass band due to the second parallel arm circuit. Thus, the radio frequency propagation loss of the first filter can further be reduced.

The second parallel arm circuit may further include an inductance element connected to the first parallel arm resonator.

Accordingly, it is possible to reduce the occurrence of the insertion loss ripple due to the second parallel arm circuit. Thus, the radio frequency propagation loss of the first filter can further be reduced.

A radio frequency circuit according to one aspect of the present disclosure includes the multiplexer according to any one of the descriptions above, and a controller configured to control conduction and non-conduction of the first switch.

Thus, it is possible to provide a radio frequency circuit in which the radio frequency propagation loss is reduced while reducing the switch loss of the multiplexer.

A radio frequency circuit according to one aspect of the present disclosure includes the multiplexer according to any one of the descriptions above, and a controller configured to control conduction and non-conduction of the second switch.

Thus, it is possible to provide the radio frequency circuit in which the radio frequency propagation loss is reduced while reducing the switch loss of the multiplexer.

A communication device according to one aspect of the present disclosure includes an RF signal processing circuit configured to process a radio frequency signal to be transmitted or received by an antenna element, and the radio frequency circuit according to any one of the descriptions above, which is configured to transfer the radio frequency signal between the antenna element and the RF signal processing circuit.

Thus, it is possible to provide a communication device in which the radio frequency propagation loss is reduced while reducing the switch loss of the multiplexer.

According to the multiplexer, the radio frequency circuit, and the communication device of the present disclosure, the propagation losses of the radio frequency signals can be reduced in the CA mode and the non-CA mode.

DETAILED DESCRIPTION

Figure 1:
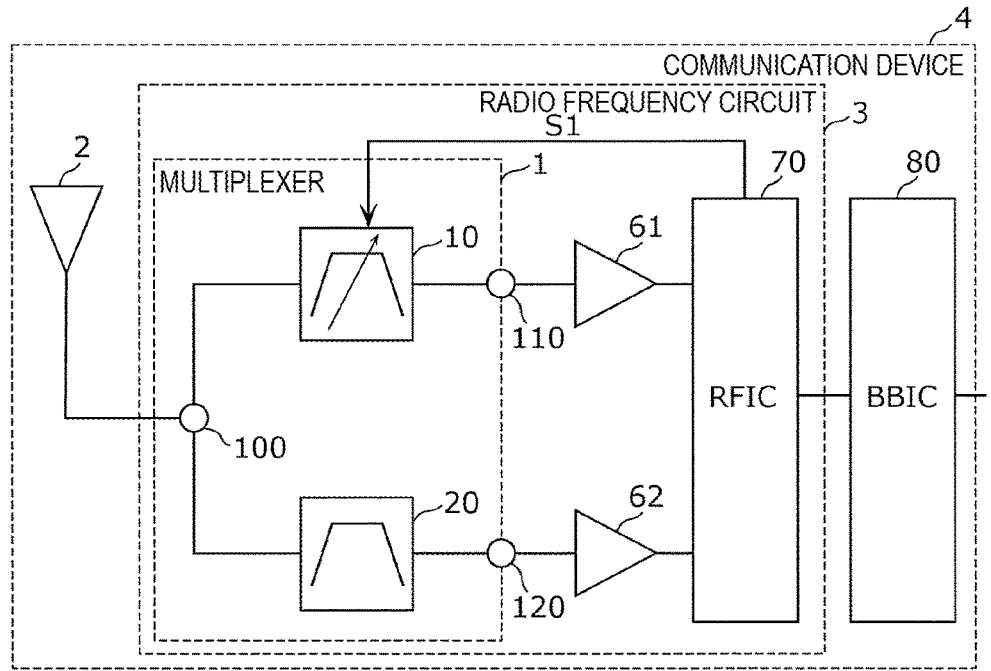
FIG. 1 is a structural diagram of a communication device according to a first embodiment.

Embodiments of the present disclosure are described below in detail with reference to the drawings. Each of the embodiments described below demonstrates a comprehensive or specific example. Numerical values, shapes, materials, constituent elements, arrangements and connection forms of the constituent elements, and the like described in the following embodiments are examples and the present disclosure is not limited thereto. Among the constituent elements of the following embodiments, constituent elements which are not described in the independent claims are described as optional constituent elements. The sizes of the constituent elements illustrated in the drawings or the ratios of the sizes are not necessarily strict. In the drawings, substantially the same components are represented by the same reference symbols and redundant description may be omitted or simplified. For circuit elements such as a resonator, constants may be adjusted as appropriate depending on required specifications or the like. Therefore, the constants may vary even if the circuit elements are represented by the same reference symbols.

First Embodiment

[1.1 Basic Structure of Communication Device]

FIG. 1 is a structural diagram of a communication device 4 according to a first embodiment. In addition to the communication device 4 according to this embodiment, FIG. 1 illustrates a radio frequency circuit 3, a multiplexer 1, and an antenna element 2 connected to the communication device 4 according to this embodiment.

The communication device 4 includes the radio frequency circuit 3 and a baseband signal processing circuit (BBIC) 80. The radio frequency circuit 3 includes the multiplexer 1, reception amplification circuits 61 and 62, and an RF signal processing circuit (RFIC) 70.

The RFIC 70 performs signal processing such as down-conversion for a radio frequency reception signal input from the antenna element 2 via a reception signal path and outputs the reception signal generated by the signal processing to the BBIC 80. For example, the signal processed by the BBIC 80 is used for image display as an image signal or for telephone conversation as a voice signal.

The RFIC 70 includes a controller configured to switch conduction (may hereinafter be referred to as ON) and non-conduction (may hereinafter be referred to as OFF) of a switch provided to a filter 10 that constitutes the multiplexer 1.

The multiplexer 1 includes a common terminal 100, an input/output terminal 110 (first input/output terminal), an input/output terminal 120 (second input/output terminal), the filter 10 (first filter), and a filter 20 (second filter).

The filter 10 is a first filter that is arranged between the common terminal 100 and the input/output terminal 110 and passes a radio frequency signal in a first frequency band allocated as a pass band. The filter 10 includes a switch SW1 (see FIG. 2A and FIG. 2B) and a bandpass characteristic is variable by ON/OFF switching of the switch SW1.

The filter 20 is a second filter that is arranged between the common terminal 100 and the input/output terminal 120 and passes a radio frequency signal in a second frequency band allocated as a pass band.

The reception amplification circuit 61 amplifies the radio frequency signal (radio frequency reception signal in this embodiment) passing through the antenna element 2 and the filter 10 and outputs the radio frequency signal to the RFIC 70.

The reception amplification circuit 62 amplifies the radio frequency signal (radio frequency reception signal in this embodiment) passing through the antenna element 2 and the filter 20 and outputs the radio frequency signal to the RFIC 70.

With the structure described above, the communication device 4 can cause the controller to switch a CA mode and a non-CA mode. The CA mode is a mode in which radio frequency signals in two or more frequency bands (bands) are simultaneously passed among radio frequency signals in a plurality of different frequency bands. The non-CA mode is a mode in which only a radio frequency signal in one frequency band (band) is passed among radio frequency signals in a plurality of different frequency bands.

The multiplexer 1, the radio frequency circuit 3, and the communication device 4 may include other circuit elements between the constituent elements described above.

The RFIC 70 need not include the controller configured to switch ON and OFF of the switch of the filter 10 and the radio frequency circuit 3 only needs to include the controller. As an example in which the controller is arranged in the radio frequency circuit 3 except the RFIC 70, there is a structural example in which a switch IC having the switch and the controller integrated together is arranged in the radio frequency circuit 3 except the RFIC 70. That is, the radio frequency circuit 3 only needs to include the multiplexer 1 and the controller and need not include the RFIC 70. In this case, the communication device 4 includes the RFIC 70.

[1.2 Circuit Structure of Multiplexer 1]

As illustrated in FIG. 1, the multiplexer 1 includes the common terminal 100, the input/output terminals 110 and 120, and the filters 10 and 20. Description is made of the structure of the filter 10 that is a main component of the multiplexer 1 according to this embodiment.

Figure 2A:
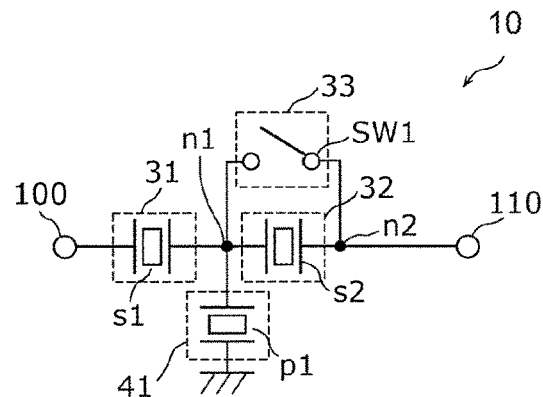
FIG. 2A is a circuit structure diagram illustrating a case in which a first switch of a first filter is OFF according to the first embodiment.
Figure 2B:
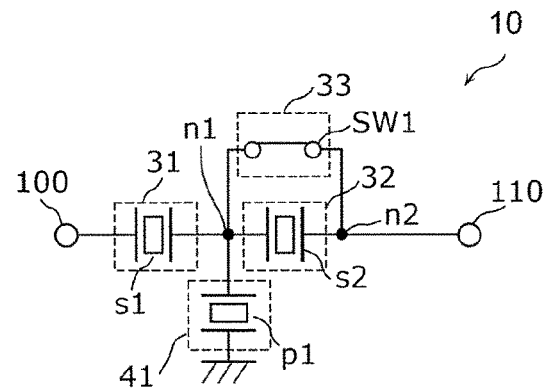
FIG. 2B is a circuit structure diagram illustrating a case in which the first switch of the first filter is ON according to the first embodiment.

FIG. 2A is a circuit structure diagram illustrating a case in which the switch SW1 of the filter 10 is OFF according to the first embodiment. FIG. 2B is a circuit structure diagram illustrating a case in which the switch SW1 of the filter 10 is ON according to the first embodiment.

As illustrated in FIG. 2A and FIG. 2B, the filter 10 includes series arm circuits 31, 32, and 33 and a parallel arm circuit 41. The series arm circuits 31 and 32 are a first series arm circuit and a second series arm circuit that are arranged between the common terminal 100 and the input/output terminal 110 and are connected in series. The series arm circuit 33 is a third series arm circuit connected in parallel to the series arm circuit 32. The parallel arm circuit 41 is a first parallel arm circuit connected to a ground and to a node n1 on a first path connecting the common terminal 100 and the input/output terminal 110.

The series arm circuit 31 includes a series arm resonator s1 that is an acoustic wave resonator having an input terminal and an output terminal connected on the first path.

The series arm circuit 32 includes a series arm resonator s2 (first series arm resonator) that is an acoustic wave resonator having an input terminal and an output terminal connected on the first path.

The series arm circuit 33 includes the switch SW1 (first switch) having an input terminal and an output terminal connected on a second path connecting two nodes n1 and n2 where the series arm circuit 32 and the series arm circuit 33 are connected in parallel.

Specifically, the switch SW1 is switched ON (conduction) and OFF (non-conduction) in response to a control signal S1 from the controller in the RFIC 70 or the like.

The switch SW1 is an SPST (single pole/single throw) switch element. For example, the switch SW1 is an FET (field effect transistor) switch or a diode switch formed of GaAs or a CMOS (complementary metal oxide semiconductor). For example, the switch SW1 is constructed as a switch IC (integrated circuit). The switch SW1 is not limited to the semiconductor switch formed on a semiconductor substrate but may be a mechanical switch constructed in MEMS (micro-electro-mechanical systems).

The parallel arm circuit 41 includes a parallel arm resonator p1 (first parallel arm resonator) that is an acoustic wave resonator connected between the node n1 and the ground.

Examples of the structure of the acoustic wave resonator serving as each of the series arm circuits and the parallel arm circuit include a surface acoustic wave (SAW) resonator, an SMR (solidly mounted resonator), and an FBAR (film bulk acoustic resonator) that uses a BAW (bulk acoustic wave).

In the circuit structure described above, when the filters 10 and 20 are operated simultaneously (CA mode), the controller brings the switch SW1 into the non-conductive state. When only the filter 10 out of the filters 10 and 20 is operated (non-CA mode), the controller brings the switch SW1 into the conductive state. That is, in the multiplexer 1, when the radio frequency signals in the first frequency band and the second frequency band are passed simultaneously, the switch SW1 is in the non-conductive state and, when only the radio frequency signal in the first frequency band out of the first frequency band and the second frequency band is passed, the switch SW1 is in the conductive state.

According to the structure described above, when the radio frequency signals in the first frequency band and the second frequency band are passed simultaneously (CA mode), the radio frequency signal in the first frequency band passes through the filter 10 without necessarily passing through the switch SW1. Therefore, a switch loss of the filter 10 can be reduced. When only the radio frequency signal in the first frequency band out of the first frequency band and the second frequency band is passed, the series arm circuit 32 is bypassed by conduction of the switch SW1. Therefore, the impedance of a parallel combination circuit of the series arm circuits 32 and 33 is reduced. Thus, a radio frequency propagation loss in a main path of the filter 10 can be reduced. Accordingly, the radio frequency propagation loss can be reduced while reducing the switch loss of the multiplexer 1.

[1.3 Bandpass Characteristics of Multiplexer 1]

The bandpass characteristic of the filter 10 that constitutes the multiplexer 1 is described. The circuit structure of the filter 20 is optional and therefore description of a bandpass characteristic of the filter 20 is omitted. Further, this embodiment shows an example in which the filter 10 is applied to, for example, LTE (Long Term Evolution) Band 40 (2300 to 2400 MHz) and the filter 20 is applied to, for example, LTE Band 38 (2570 to 2620 MHz) or Band 7 (reception band: 2620 to 2690 MHz). That is, the first frequency band that is the pass band of the filter 10 is lower than the second frequency band that is the pass band of the filter 20.

Figure 3A:
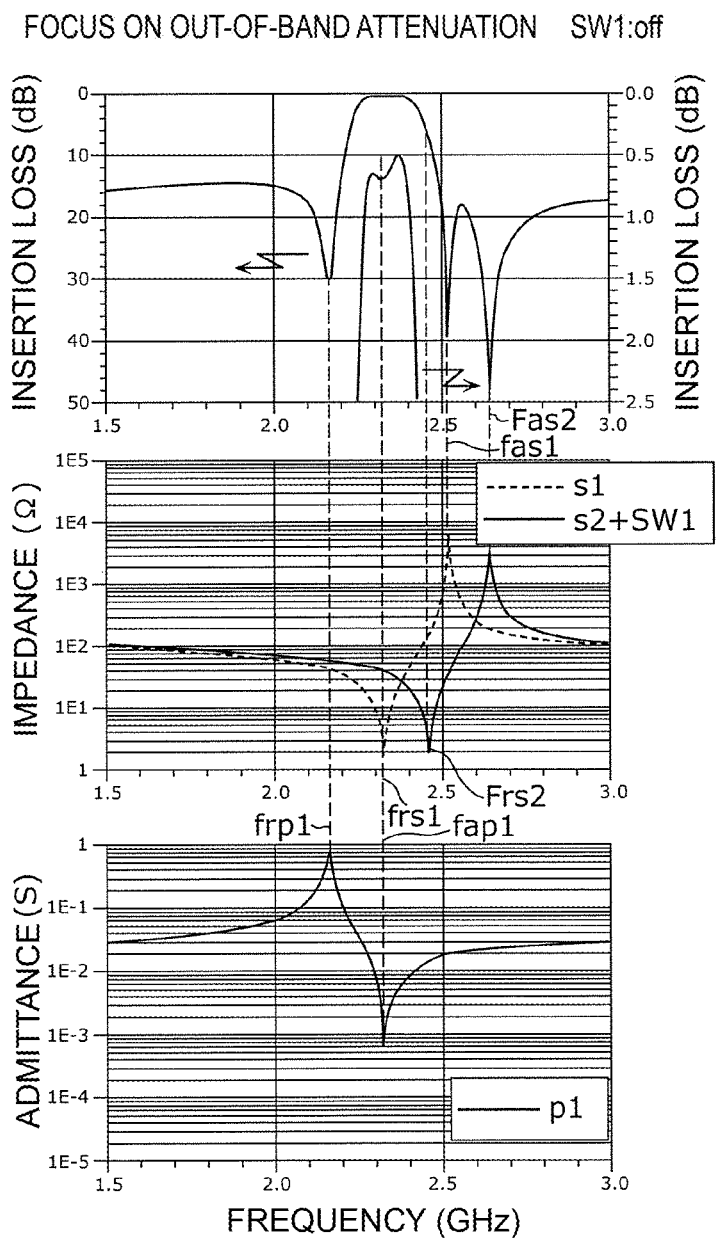
FIG. 3A is a graph illustrating a bandpass characteristic, an impedance characteristic, and an admittance characteristic in the case in which the first switch of the first filter is OFF according to the first embodiment.
Figure 3B:
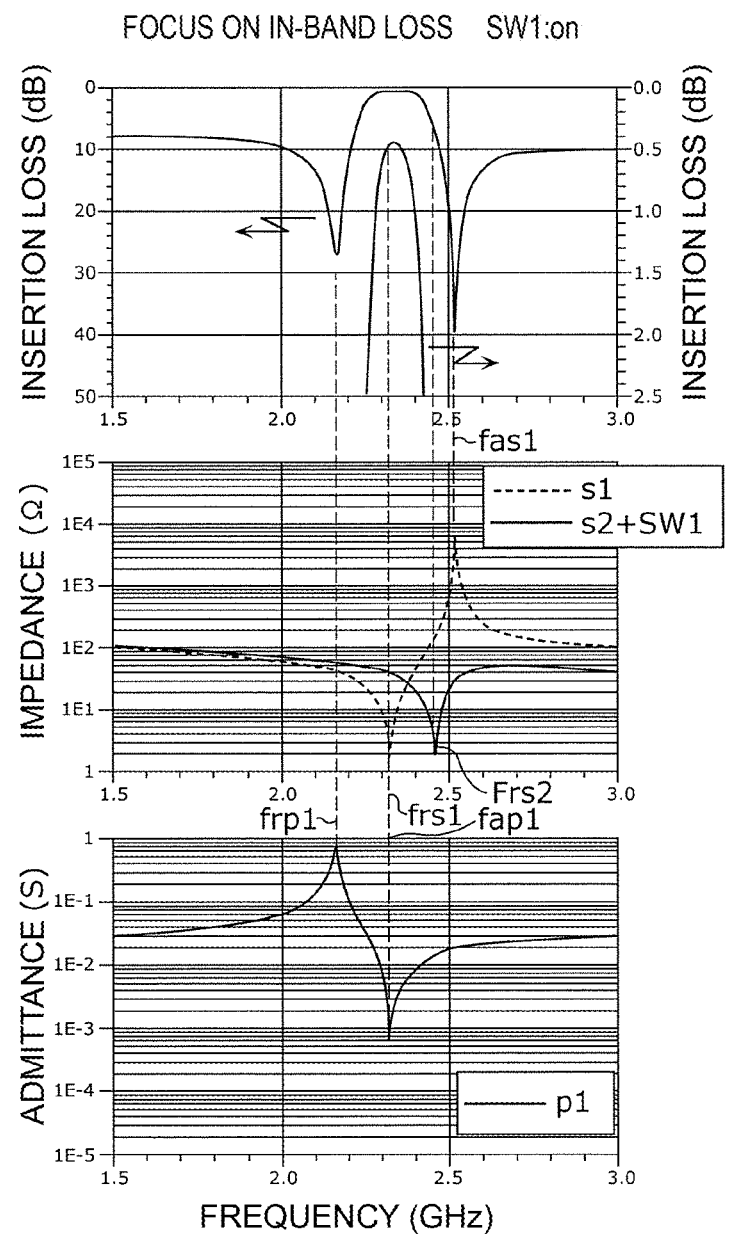
FIG. 3B is a graph illustrating a bandpass characteristic, an impedance characteristic, and an admittance characteristic in the case in which the first switch of the first filter is ON according to the first embodiment.

FIG. 3A is a graph illustrating a bandpass characteristic, an impedance characteristic, and an admittance characteristic in the case in which the switch SW1 of the filter 10 is OFF according to the first embodiment. FIG. 3B is a graph illustrating a bandpass characteristic, an impedance characteristic, and an admittance characteristic in the case in which the switch SW1 of the filter 10 is ON according to the first embodiment. More specifically, FIG. 3A and FIG. 3B illustrate, in their upper stages, bandpass characteristics of the filter 10 in the case in which the switch SW1 is OFF and in the case in which the switch SW1 is ON, respectively. FIG. 3A and FIG. 3B illustrate, in their middle stages, impedance characteristics of the series arm circuits in the case in which the switch SW1 is OFF and in the case in which the switch SW1 is ON, respectively. FIG. 3A and FIG. 3B illustrate, in their lower stages, admittance characteristics of the parallel arm circuit in the case in which the switch SW1 is OFF and in the case in which the switch SW1 is ON, respectively.

As illustrated in FIG. 2A and FIG. 2B, the filter 10 constitutes a ladder type acoustic wave filter circuit including the series arm circuits 31 to 33 and the parallel arm circuit 41. As illustrated in the upper stages and the middle stages of FIG. 3A and FIG. 3B, a resonant frequency frs1 of the series arm circuit 31 (series arm resonator s1) is located within the pass band and an anti-resonant frequency fas1 of the series arm circuit 31 (series arm resonator s1) is located on a higher side of the pass band. As illustrated in the upper stages and the lower stages of FIG. 3A and FIG. 3B, a resonant frequency frp1 of the parallel arm circuit 41 (parallel arm resonator p1) is located on a lower side of the pass band and an anti-resonant frequency fap1 of the parallel arm circuit (parallel arm resonator p1) is located within the pass band. That is, the resonant frequency frs1 and the anti-resonant frequency fap1 define a pass band width and a center frequency, the anti-resonant frequency fas1 defines the frequency of an attenuation pole on the higher side of the pass band, and the resonant frequency frp1 defines the frequency of an attenuation pole on the lower side of the pass band.

The filter 10 includes the series arm circuits 32 and 33 in addition to the series arm circuit 31 and the parallel arm circuit 41 that define the pass band, the higher side of the pass band, and the lower side of the pass band.

When the switch SW1 of the series arm circuit 33 is OFF (FIG. 2A), an anti-resonant frequency Fas2 of the parallel combination circuit of the series arm circuits 32 and 33 (series arm resonator s2+switch SW1) is located within the pass band of the filter 20 (second frequency band) as illustrated in the upper stage and the middle stage of FIG. 3A.

Thus, when the radio frequency signals in the first frequency band and the second frequency band are passed simultaneously (CA mode), attenuation of the filter 10 in the second frequency band can be secured greatly. Accordingly, an in-band insertion loss of the filter 20 can be reduced.

As illustrated in the upper stage and the middle stage of FIG. 3A, a resonant frequency Frs2 of the parallel combination circuit of the series arm circuits 32 and 33 is higher than the resonant frequency frs1 of the series arm circuit 31 and is higher than a higher frequency end of the first frequency band.

Accordingly, the resonant frequency Frs2 of the parallel combination circuit is located outside the pass band of the filter 10, thereby being capable of reducing the occurrence of an insertion loss ripple in this pass band due to the parallel combination circuit. Thus, the radio frequency propagation loss of the filter 10 can further be reduced.

When the switch SW1 of the series arm circuit 33 is ON (FIG. 2B), the series arm circuit 32 is bypassed and the anti-resonant frequency Fas2 of the parallel combination circuit of the series arm circuits 32 and 33 (series arm resonator s2+switch SW1) disappears as illustrated in the upper stage and the middle stage of FIG. 3B.

When only the radio frequency signal in the first frequency band out of the first frequency band and the second frequency band is passed (non-CA mode), it is appropriate that the bandpass characteristic of the filter 10 be improved without necessarily consideration of the bandpass characteristic of the filter 20.

As illustrated in the upper stage and the middle stage of FIG. 3B, the resonant frequency Frs2 of the parallel combination circuit of the series arm circuits 32 and 33 is higher than the resonant frequency frs1 of the series arm circuit 31 and is higher than the higher frequency end of the first frequency band.

Accordingly, the resonant frequency Frs2 of the parallel combination circuit is located outside the pass band of the filter 10, thereby being capable of reducing the occurrence of the insertion loss ripple in this pass band due to the parallel combination circuit. Thus, the radio frequency propagation loss of the filter 10 can further be reduced.

Figure 3C:
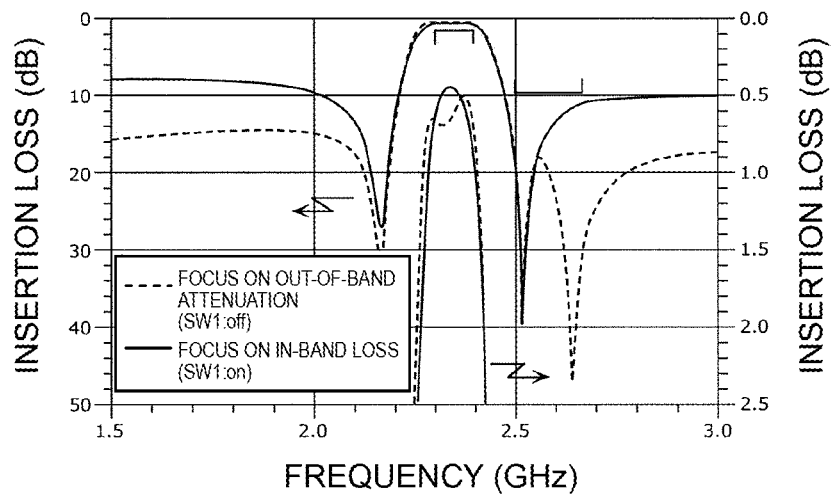
FIG. 3C is a graph illustrating comparison of the bandpass characteristics between the case in which the first switch of the first filter is ON and the case in which the first switch of the first filter is OFF according to the first embodiment.

FIG. 3C is a graph illustrating comparison of the bandpass characteristics between the case in which the switch SW1 of the filter 10 is ON and the case in which the switch SW1 of the filter 10 is OFF according to the first embodiment.

As described above, when the switch SW1 is OFF, the radio frequency signals in the first frequency band and the second frequency band are passed simultaneously. Therefore, the bandpass characteristic of the filter 10 is a characteristic focusing on out-of-band attenuation for greatly securing the attenuation in the second frequency band and reducing the in-band insertion loss of the filter 20.

When the switch SW1 is ON, only the radio frequency signal in the first frequency band out of the first frequency band and the second frequency band is passed. Therefore, the bandpass characteristic of the filter 10 is a characteristic focusing on the in-band insertion loss for improving the bandpass characteristic of the filter 10 without necessarily consideration of the bandpass characteristic of the filter 20.

Second Embodiment

The multiplexer 1 according to the first embodiment has the structure in which the switch is arranged in the series arm circuit of the first filter. A multiplexer according to this embodiment has a structure in which the switch is arranged in the parallel arm circuit of the first filter. The structure of the multiplexer according to this embodiment is similar to the structure of the multiplexer 1 illustrated in FIG. 1 and therefore description is omitted hereinafter. The circuit structure and the bandpass characteristic of the first filter are mainly described.

[2.1 Circuit Structure of Filter 11 (First Filter)]

Figure 4A:
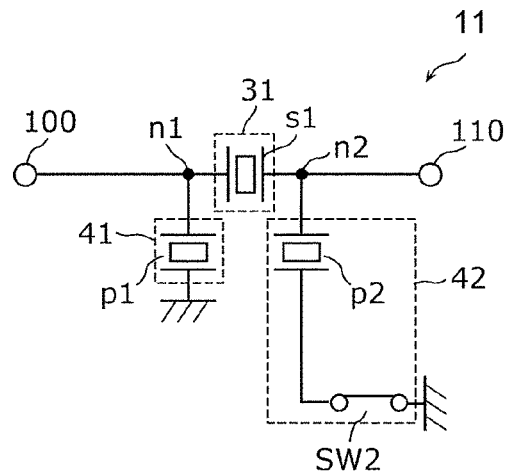
FIG. 4A is a circuit structure diagram illustrating a case in which a second switch of the first filter is ON according to a second embodiment.
Figure 4B:
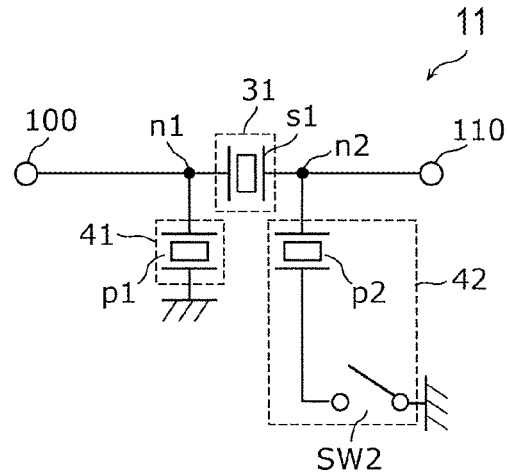
FIG. 4B is a circuit structure diagram illustrating a case in which the second switch of the first filter is OFF according to the second embodiment.

FIG. 4A is a circuit structure diagram illustrating a case in which a switch SW2 of a filter 11 is ON according to the second embodiment. FIG. 4B is a circuit structure diagram illustrating a case in which the switch SW2 of the filter 11 is OFF according to the second embodiment.

As illustrated in FIG. 4A and FIG. 4B, the filter 11 includes the series arm circuit 31 and parallel arm circuits 41 and 42. The series arm circuit 31 is the first series arm circuit connected between the common terminal 100 and the input/output terminal 110. The parallel arm circuit 41 is the first parallel arm circuit connected to the ground and to the node n1 on the first path connecting the common terminal 100 and the input/output terminal 110. The parallel arm circuit 42 is a second parallel arm circuit connected to the ground and to the node n2 on the first path connecting the common terminal 100 and the input/output terminal 110.

The series arm circuit 31 includes the series arm resonator s1 that is the acoustic wave resonator having the input terminal and the output terminal connected on the first path.

The parallel arm circuit 41 includes the parallel arm resonator p1 (first parallel arm resonator) that is the acoustic wave resonator connected between the node n1 and the ground.

The parallel arm circuit 42 includes a parallel arm resonator p2 (first parallel arm resonator) that is an acoustic wave resonator connected between the node n2 and the ground, and the switch SW2 (second switch) connected between the parallel arm resonator p2 and the ground.

Specifically, the switch SW2 is switched ON (conduction) and OFF (non-conduction) in response to the control signal S1 from the controller in the RFIC 70 or the like.

The switch SW2 is an SPST switch element. For example, the switch SW2 is an FET switch or a diode switch formed of GaAs or a CMOS. For example, the switch SW2 is constructed as a switch IC. The switch SW2 is not limited to the semiconductor switch formed on a semiconductor substrate but may be a mechanical switch constructed in MEMS.

Examples of the structure of the acoustic wave resonator serving as each of the series arm circuit and the parallel arm circuits include an SAW resonator, an SMR, and an FBAR that uses a BAW.

In the circuit structure described above, when the filters 11 and 20 are operated simultaneously (CA mode), the controller brings the switch SW2 into the conductive state. When only the filter 11 out of the filters 11 and 20 is operated (non-CA mode), the controller brings the switch SW2 into the non-conductive state. That is, in the multiplexer according to this embodiment, when the radio frequency signals in the first frequency band and the second frequency band are passed simultaneously, the switch SW2 is in the conductive state and, when only the radio frequency signal in the first frequency band out of the first frequency band and the second frequency band is passed, the switch SW2 is in the non-conductive state.

According to the structure described above, when the radio frequency signals in the first frequency band and the second frequency band are passed simultaneously (CA mode), the parallel arm circuit 42 is caused to function by conduction of the switch SW2 in the filter 11. Therefore, the attenuation characteristic in the vicinity of the pass band can be enhanced without necessarily causing the radio frequency propagation loss in the main path (first path) due to the conduction of the switch SW2. When only the radio frequency signal in the first frequency band out of the first frequency band and the second frequency band is passed (non-CA mode), a combined admittance of the parallel arm circuit 42 in the first frequency band is reduced by bringing the switch SW2 into non-conduction. Therefore, an insertion loss in the pass band of the filter 11 can be reduced without necessarily causing the radio frequency propagation loss in the main path (first path) due to the non-conduction of the switch SW2. Thus, the radio frequency propagation loss can be reduced while reducing the switch loss of the multiplexer.

[2.2 Bandpass Characteristics of Multiplexer]

The bandpass characteristic of the filter 11 that constitutes the multiplexer according to this embodiment is described. The circuit structure of the filter 20 is optional and therefore description of the bandpass characteristic of the filter 20 is omitted. Further, this embodiment shows an example in which the filter 11 is applied to, for example, LTE Band 40 (2300 to 2400 MHz) and the filter 20 is applied to, for example, LTE Band 38 (2570 to 2620 MHz) or Band 7 Rx (2620 to 2690 MHz). That is, the first frequency band that is the pass band of the filter 11 is lower than the second frequency band that is the pass band of the filter 20.

Figure 5A:
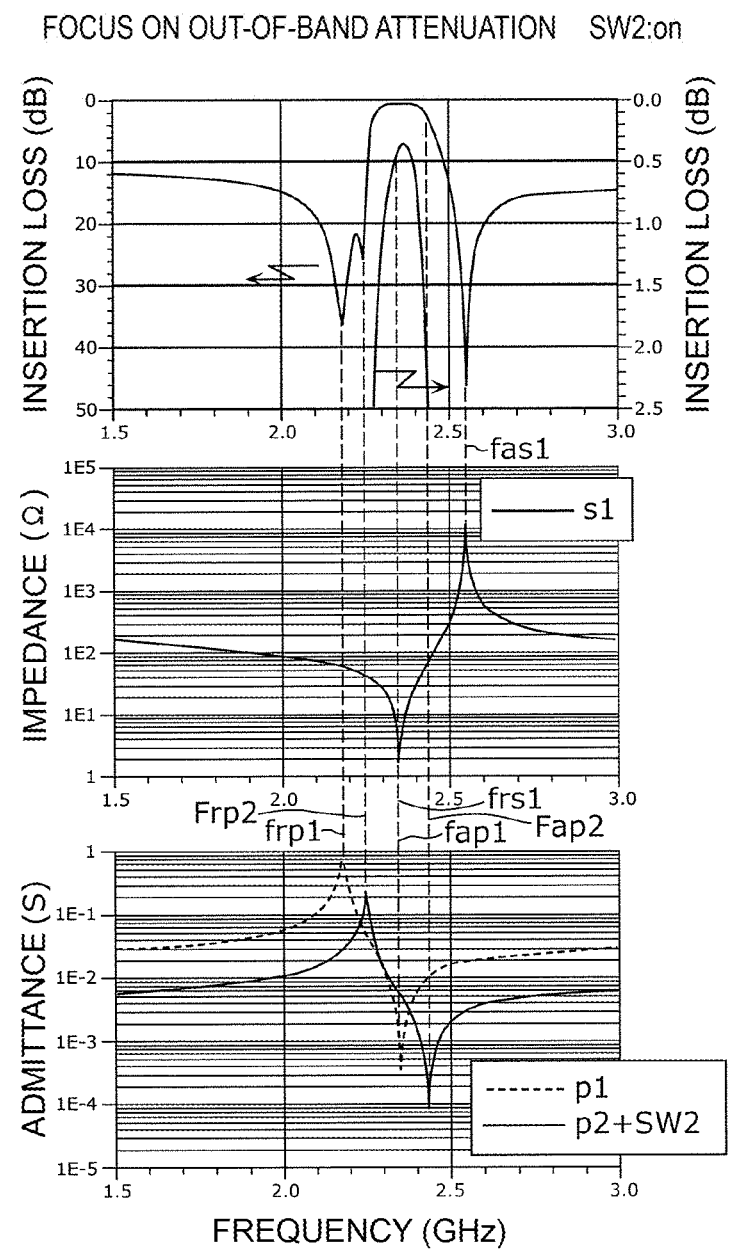
FIG. 5A is a graph illustrating a bandpass characteristic, an impedance characteristic, and an admittance characteristic in the case in which the second switch of the first filter is ON according to the second embodiment.
Figure 5B:
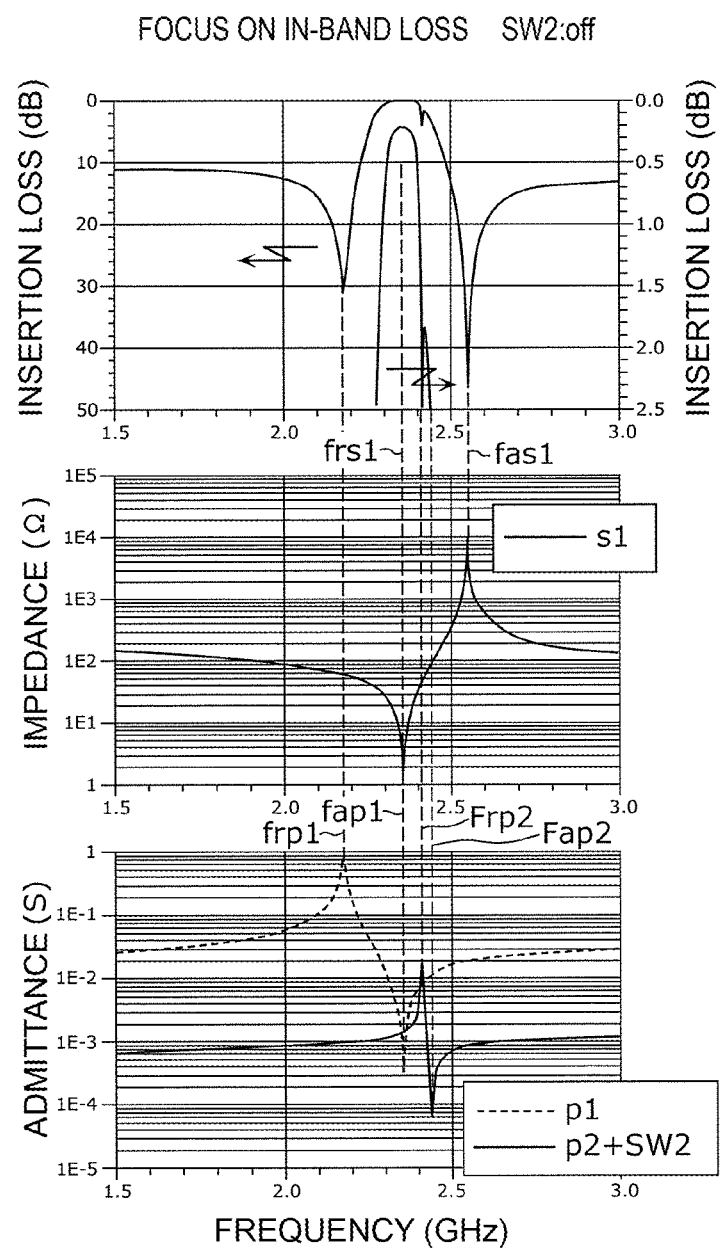
FIG. 5B is a graph illustrating a bandpass characteristic, an impedance characteristic, and an admittance characteristic in the case in which the second switch of the first filter is OFF according to the second embodiment.

FIG. 5A is a graph illustrating a bandpass characteristic, an impedance characteristic, and an admittance characteristic in the case in which the switch SW2 of the filter 11 is ON according to the second embodiment. FIG. 5B is a graph illustrating a bandpass characteristic, an impedance characteristic, and an admittance characteristic in the case in which the switch SW2 of the filter 11 is OFF according to the second embodiment. More specifically, FIG. 5A and FIG. 5B illustrate, in their upper stages, bandpass characteristics of the filter 11 in the case in which the switch SW2 is ON and in the case in which the switch SW2 is OFF, respectively. FIG. 5A and FIG. 5B illustrate, in their middle stages, impedance characteristics of the series arm circuit in the case in which the switch SW2 is ON and in the case in which the switch SW2 is OFF, respectively. FIG. 5A and FIG. 5B illustrate, in their lower stages, admittance characteristics of the parallel arm circuits in the case in which the switch SW2 is ON and in the case in which the switch SW2 is OFF, respectively.

As illustrated in FIG. 4A and FIG. 4B, the filter 11 constitutes a ladder type acoustic wave filter circuit including the series arm circuit 31 and the parallel arm circuits 41 and 42. As illustrated in the upper stages and the middle stages of FIG. 5A and FIG. 5B, the resonant frequency frs1 of the series arm circuit 31 (series arm resonator s1) is located within the pass band and the anti-resonant frequency fas1 of the series arm circuit 31 (series arm resonator s1) is located on a higher side of the pass band. As illustrated in the upper stages and the lower stages of FIG. 5A and FIG. 5B, the resonant frequency frp1 of the parallel arm circuit 41 (parallel arm resonator p1) is located on a lower side of the pass band and the anti-resonant frequency fap1 of the parallel arm circuit (parallel arm resonator p1) is located within the pass band. That is, the resonant frequency frs1 and the anti-resonant frequency fap1 define a pass band width and a center frequency, the anti-resonant frequency fas1 defines the frequency of an attenuation pole on the higher side of the pass band, and the resonant frequency frp1 defines the frequency of an attenuation pole on the lower side of the pass band.

The filter 11 includes the parallel arm circuit 42 in addition to the series arm circuit 31 and the parallel arm circuit 41 that define the pass band, the higher side of the pass band, and the lower side of the pass band.

When the switch SW2 of the parallel arm circuit 42 is ON (FIG. 4A), a resonant frequency Frp2 of the parallel arm circuit (parallel arm resonator p2+switch SW2) is lower than a lower frequency end of the first frequency band as illustrated in the upper stage and the lower stage of FIG. 5A.

Accordingly, the resonant frequency Frp2 of the parallel arm circuit 42 is located on the lower side of the pass band of the filter 11, thereby being capable of reducing the occurrence of an insertion loss ripple in this pass band due to the parallel arm circuit 42 and improving the attenuation characteristic on the lower side of the pass band. Thus, the radio frequency propagation loss of the filter 11 can further be reduced.

As illustrated in the upper stage and the lower stage of FIG. 5A, an anti-resonant frequency Fap2 of the parallel arm circuit 42 is higher than the anti-resonant frequency fap1 of the parallel arm circuit 41 and is located within the second frequency band.

Thus, when the radio frequency signals in the first frequency band and the second frequency band are passed simultaneously (CA mode), attenuation of the filter 11 in the second frequency band can be secured greatly. Accordingly, the in-band insertion loss of the filter 20 can be reduced.

When the switch SW2 of the parallel arm circuit 42 is OFF (FIG. 4B), the resonant frequency Frp2 of the parallel arm circuit 42 (parallel arm resonator p2+switch SW2) is higher than the higher frequency end of the first frequency band as illustrated in the upper stage and the lower stage of FIG. 5B.

Accordingly, when only the radio frequency signal in the first frequency band out of the first frequency band and the second frequency band is passed (non-CA mode), the resonant frequency Frp2 of the parallel arm circuit 42 is located outside the pass band of the filter 11, thereby being capable of reducing the occurrence of the insertion loss ripple in this pass band due to the parallel arm circuit 42. Thus, the radio frequency propagation loss of the filter 11 can further be reduced.

Figure 5C:
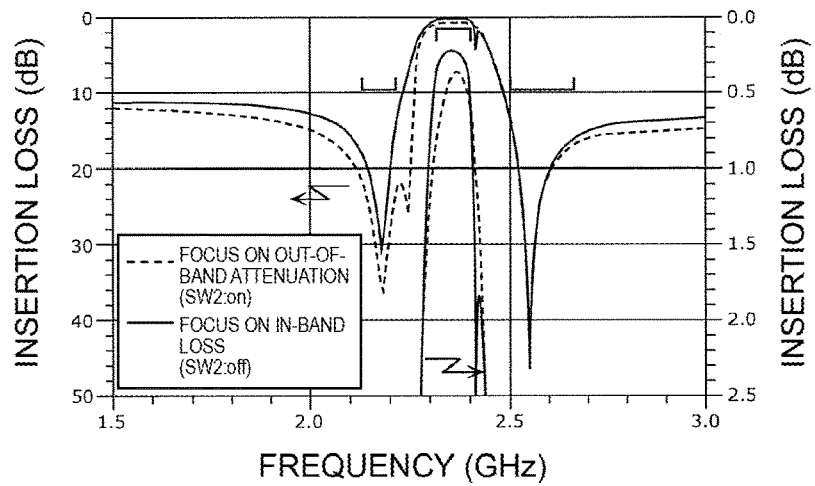
FIG. 5C is a graph illustrating comparison of the bandpass characteristics between the case in which the second switch of the first filter is ON and the case in which the second switch of the first filter is OFF according to the second embodiment.

FIG. 5C is a graph illustrating comparison of the bandpass characteristics between the case in which the switch SW2 of the filter 11 is ON and the case in which the switch SW2 of the filter 11 is OFF according to the second embodiment.

As described above, when the switch SW2 is ON, the radio frequency signals in the first frequency band and the second frequency band are passed simultaneously. Therefore, the bandpass characteristic of the filter 11 is the characteristic focusing on the out-of-band attenuation for greatly securing the attenuation in the second frequency band and reducing the in-band insertion loss of the filter 20.

When the switch SW2 is OFF, only the radio frequency signal in the first frequency band out of the first frequency band and the second frequency band is passed. Therefore, the bandpass characteristic of the filter 11 is the characteristic focusing on the in-band insertion loss for improving the bandpass characteristic of the filter 11 without necessarily consideration of the bandpass characteristic of the filter 20.

Third Embodiment

The multiplexer 1 according to the first embodiment has the structure in which the switch is arranged in the series arm circuit of the first filter. A multiplexer according to this embodiment has a structure in which the switches are arranged in both the series arm circuit and the parallel arm circuit of the first filter. The structure of the multiplexer according to this embodiment is similar to the structure of the multiplexer 1 illustrated in FIG. 1 and therefore description is omitted hereinafter. The circuit structure and the bandpass characteristic of the first filter are mainly described.

[3.1 Circuit Structure of Filter 12 (First Filter)]

Figure 6A:
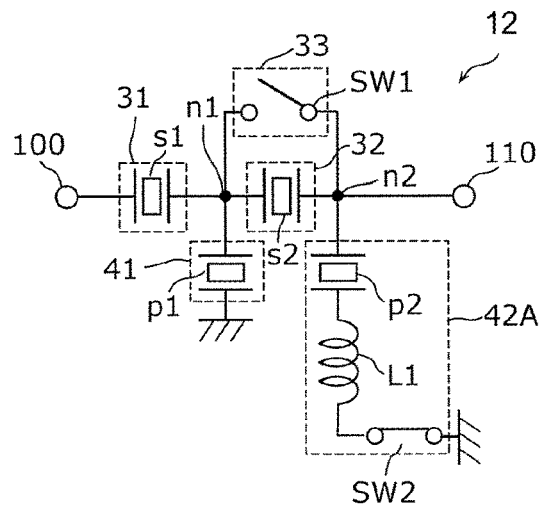
FIG. 6A is a circuit structure diagram illustrating a case in which the first switch is OFF and the second switch is ON in the first filter according to a third embodiment.
Figure 6B:
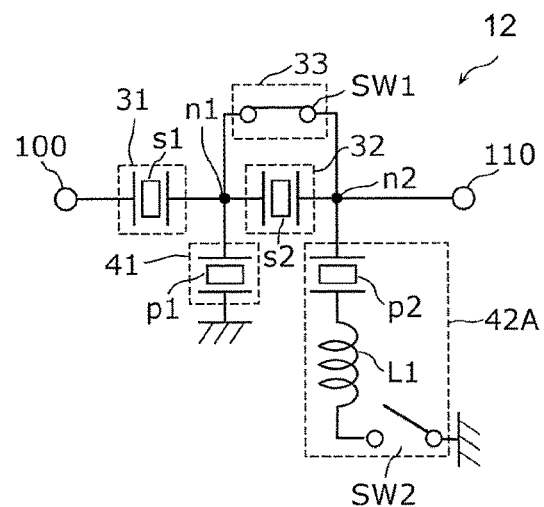
FIG. 6B is a circuit structure diagram illustrating a case in which the first switch is ON and the second switch is OFF in the first filter according to the third embodiment.

FIG. 6A is a circuit structure diagram illustrating a case in which the switch SW1 is OFF and the switch SW2 is ON in a filter 12 according to the third embodiment. FIG. 6B is a circuit structure diagram illustrating a case in which the switch SW1 is ON and the switch SW2 is OFF in the filter 12 according to the third embodiment.

As illustrated in FIG. 6A and FIG. 6B, the filter 12 includes the series arm circuits 31, 32, and 33 and parallel arm circuits 41 and 42A. The filter 12 according to this embodiment differs from the filter 10 according to the first embodiment only in that the parallel arm circuit 42A is added. Description of the features of the filter 12 that are identical to those of the filter 10 is omitted and the different feature is mainly described below.

The parallel arm circuit 42A includes the parallel arm resonator p2 (first parallel arm resonator) that is the acoustic wave resonator connected between the node n2 and the ground, an inductor L1 (inductance element) connected to the parallel arm resonator p2, and the switch SW2 (second switch) connected between the parallel arm resonator p2 and the ground. The parallel arm resonator p2, the inductor L1, and the switch SW2 are connected in series between the node n2 and the ground.

In the circuit structure described above, when the filters 12 and 20 are operated simultaneously (CA mode), the controller brings the switch SW1 into the non-conductive state and the switch SW2 into the conductive state. When only the filter 12 out of the filters 12 and 20 is operated (non-CA mode), the controller brings the switch SW1 into the conductive state and the switch SW2 into the non-conductive state. That is, in the multiplexer according to this embodiment, when the radio frequency signals in the first frequency band and the second frequency band are passed simultaneously, the switch SW1 is in the non-conductive state and the switch SW2 is in the conductive state and, when only the radio frequency signal in the first frequency band out of the first frequency band and the second frequency band is passed, the switch SW1 is in the conductive state and the switch SW2 is in the non-conductive state.

According to the structure described above, when the radio frequency signals in the first frequency band and the second frequency band are passed simultaneously (CA mode), the radio frequency signal in the first frequency band passes through the filter 12 without necessarily passing through the switch SW1. Therefore, a switch loss of the filter 12 can be reduced. Further, the parallel arm circuit 42A is caused to function by conduction of the switch SW2. Therefore, the attenuation characteristic in the vicinity of the pass band can be enhanced without necessarily causing the radio frequency propagation loss in the main path (first path) due to the conduction of the switch SW2. At this time, the resonant frequency of the parallel arm circuit 42A can be adjusted by the inductor L1. Therefore, attenuation of the filter 12 in the second frequency band can be adjusted with high accuracy. Thus, the in-band insertion loss of the filter 20 can be reduced.

When only the radio frequency signal in the first frequency band out of the first frequency band and the second frequency band is passed, the series arm circuit 32 is bypassed by conduction of the switch SW1. Therefore, the impedance of the parallel combination circuit of the series arm circuits 32 and 33 is reduced. Thus, a radio frequency propagation loss in a main path of the filter 12 can be reduced. Accordingly, the radio frequency propagation loss can be reduced while reducing the switch loss of the multiplexer 1. Further, a combined admittance of the parallel arm circuit 42A in the first frequency band is reduced by bringing the switch SW2 into non-conduction. Therefore, an insertion loss in the pass band of the filter 12 can be reduced without necessarily causing the radio frequency propagation loss in the main path (first path) due to the non-conduction of the switch SW2. Thus, the radio frequency propagation loss can be reduced while reducing the switch loss of the multiplexer.

[3.2 Bandpass Characteristics of Multiplexer]

Figure 7A:
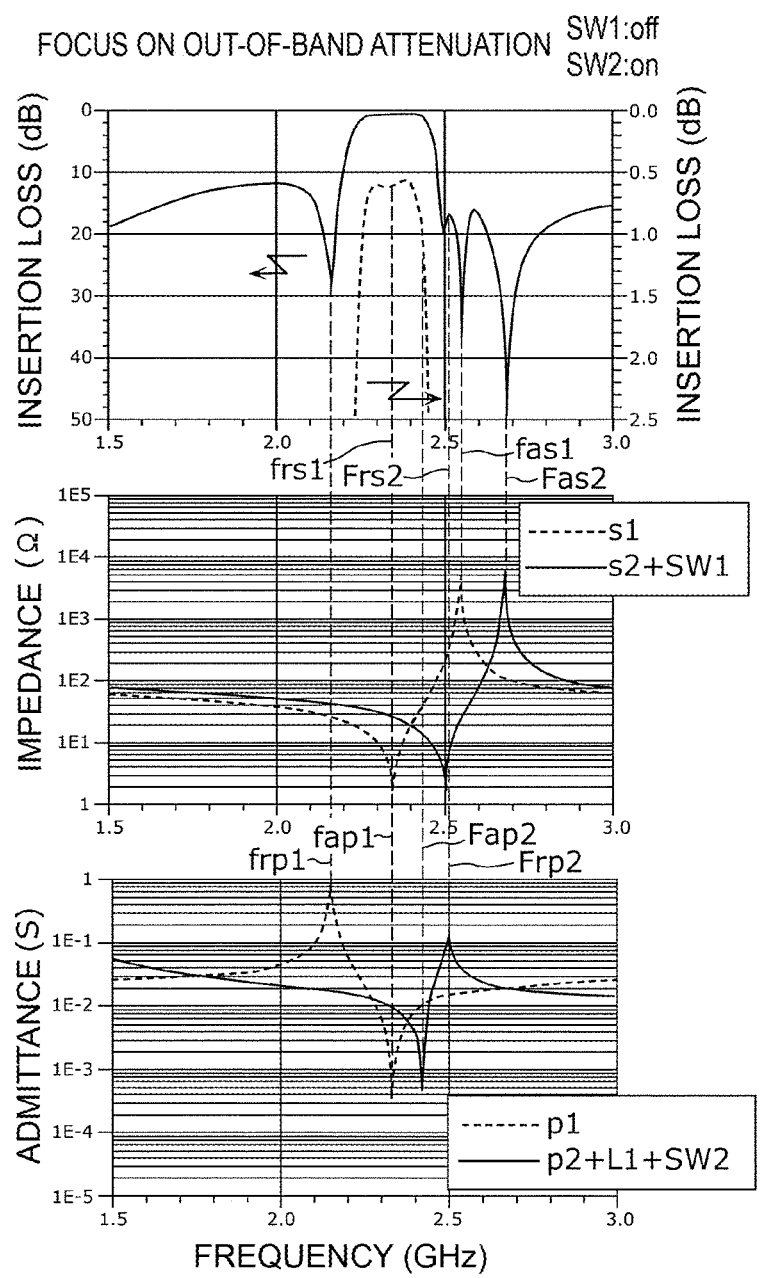
FIG. 7A is a graph illustrating a bandpass characteristic, an impedance characteristic, and an admittance characteristic in the case in which the first switch is OFF and the second switch is ON in the first filter according to the third embodiment.
Figure 7B:
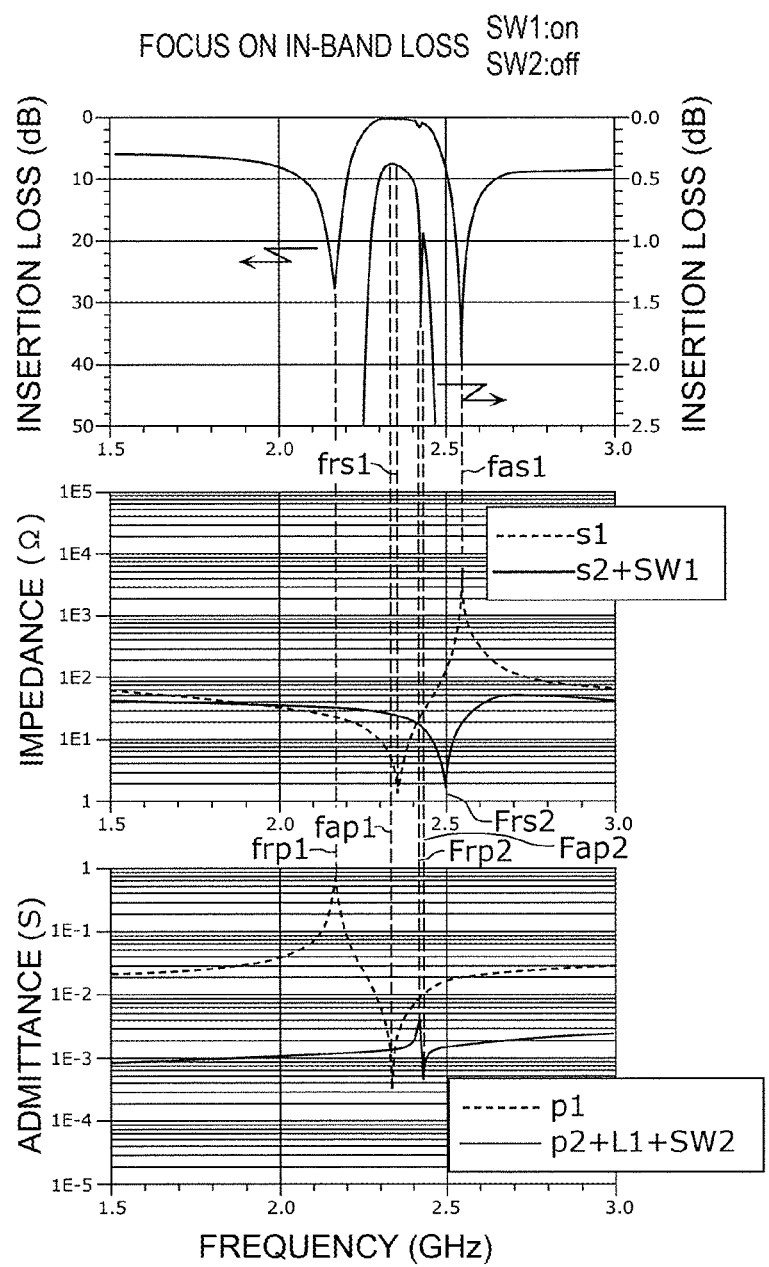
FIG. 7B is a graph illustrating a bandpass characteristic, an impedance characteristic, and an admittance characteristic in the case in which the first switch is ON and the second switch is OFF in the first filter according to the third embodiment.

FIG. 7A is a graph illustrating a bandpass characteristic, an impedance characteristic, and an admittance characteristic in a case in which the switch SW1 is OFF and the switch SW2 is ON in the filter 12 according to the third embodiment. FIG. 7B is a graph illustrating a bandpass characteristic, an impedance characteristic, and an admittance characteristic in a case in which the switch SW1 is ON and the switch SW2 is OFF in the filter 12 according to the third embodiment. More specifically, FIG. 7A and FIG. 7B illustrate, in their upper stages, bandpass characteristics of the filter 12 in the case in which the switch SW1 is OFF and the switch SW2 is ON and in the case in which the switch SW1 is ON and the switch SW2 is OFF, respectively. FIG. 7A and FIG. 7B illustrate, in their middle stages, impedance characteristics of the series arm circuits in the case in which the switch SW1 is OFF and the switch SW2 is ON and in the case in which the switch SW1 is ON and the switch SW2 is OFF, respectively. FIG. 7A and FIG. 7B illustrate, in their lower stages, admittance characteristics of the parallel arm circuits in the case in which the switch SW1 is OFF and the switch SW2 is ON and in the case in which the switch SW1 is ON and the switch SW2 is OFF, respectively.

As illustrated in FIG. 6A and FIG. 6B, the filter 12 constitutes a ladder type acoustic wave filter circuit including the series arm circuit 31 and the parallel arm circuits 41 and 42A.

The filter 12 includes the series arm circuits 32 and 33 and the parallel arm circuit 42A in addition to the series arm circuit 31 and the parallel arm circuit 41 that define the pass band, a higher side of the pass band, and a lower side of the pass band.

When the switch SW1 of the series arm circuit 33 is OFF (FIG. 6A), the anti-resonant frequency Fas2 of the parallel combination circuit of the series arm circuits 32 and 33 (series arm resonator s2+switch SW1) is located within the pass band of the filter 20 (second frequency band) as illustrated in the upper stage and the middle stage of FIG. 7A.

Thus, when the radio frequency signals in the first frequency band and the second frequency band are passed simultaneously (CA mode), the attenuation of the filter 12 in the second frequency band can be secured greatly. Accordingly, the in-band insertion loss of the filter 20 can be reduced.

As illustrated in the upper stage and the middle stage of FIG. 7A, the resonant frequency Frs2 of the parallel combination circuit of the series arm circuits 32 and 33 is higher than the resonant frequency frs1 of the series arm circuit 31 and is higher than the higher frequency end of the first frequency band.

Accordingly, the resonant frequency Frs2 of the parallel combination circuit is located outside the pass band of the filter 12, thereby being capable of reducing the occurrence of an insertion loss ripple in this pass band due to the parallel combination circuit. Thus, the radio frequency propagation loss of the filter 12 can further be reduced.

Further, the switch SW2 of the parallel arm circuit 42A is ON (FIG. 6A) and therefore the resonant frequency Frp2 and the anti-resonant frequency Fap2 of the parallel arm circuit 42A (parallel arm resonator p2+switch SW2) are higher than the higher frequency end of the first frequency band and are located within the second frequency band as illustrated in the upper stage and the lower stage of FIG. 7A.

Thus, when the radio frequency signals in the first frequency band and the second frequency band are passed simultaneously (CA mode), the attenuation of the filter 12 in the second frequency band can be secured greatly. Accordingly, the in-band insertion loss of the filter 20 can be reduced.

When the switch SW1 of the series arm circuit 33 is ON (FIG. 6B), the series arm circuit 32 is bypassed and the anti-resonant frequency Fas2 of the parallel combination circuit of the series arm circuits 32 and 33 (series arm resonator s2+switch SW1) disappears as illustrated in the upper stage and the middle stage of FIG. 7B.

When only the radio frequency signal in the first frequency band out of the first frequency band and the second frequency band is passed (non-CA mode), it is appropriate that the bandpass characteristic of the filter 12 be improved without necessarily consideration of the bandpass characteristic of the filter 20.

As illustrated in the upper stage and the middle stage of FIG. 7B, the resonant frequency Frs2 of the parallel combination circuit of the series arm circuits 32 and 33 is higher than the resonant frequency frs1 of the series arm circuit 31 and is higher than the higher frequency end of the first frequency band.

Accordingly, the resonant frequency Frs2 of the parallel combination circuit is located outside the pass band of the filter 12, thereby being capable of reducing the occurrence of the insertion loss ripple in this pass band due to the parallel combination circuit. Thus, the radio frequency propagation loss of the filter 12 can further be reduced.

Further, the switch SW2 of the parallel arm circuit 42A is OFF (FIG. 6B) and therefore the resonant frequency Frp2 of the parallel arm circuit 42A (parallel arm resonator p2+switch SW2) is higher than the higher frequency end of the first frequency band as illustrated in the upper stage and the lower stage of FIG. 7B.

Accordingly, when only the radio frequency signal in the first frequency band out of the first frequency band and the second frequency band is passed (non-CA mode), the resonant frequency Frp2 of the parallel arm circuit 42A is located outside the pass band of the filter 12, thereby being capable of reducing the occurrence of an insertion loss ripple in this pass band due to the parallel arm circuit 42A. Thus, the radio frequency propagation loss of the filter 12 can further be reduced.

Figure 7C:
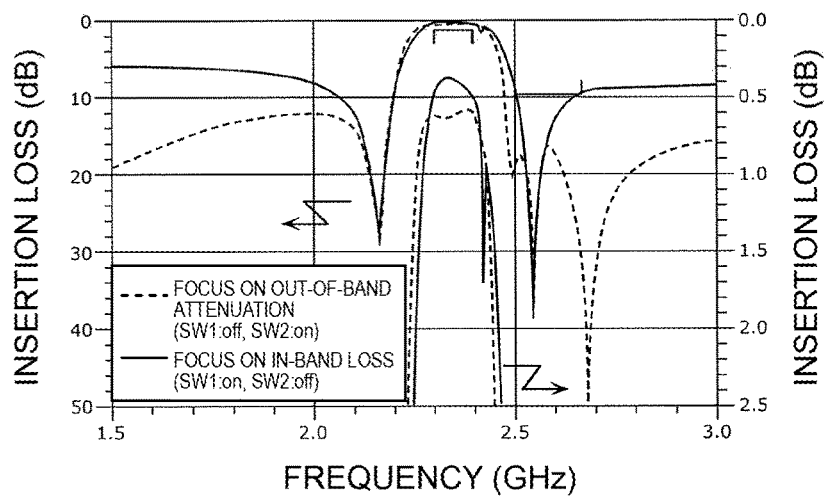
FIG. 7C is a graph illustrating comparison of the bandpass characteristics between the case in which the first switch is ON and the second switch is OFF and the case in which the first switch is OFF and the second switch is ON in the first filter according to the third embodiment.

FIG. 7C is a graph illustrating comparison of the bandpass characteristics between the case in which the switch SW1 is ON and the switch SW2 is OFF and the case in which the switch SW1 is OFF and the switch SW2 is ON in the filter 12 according to the third embodiment.

As described above, when the switch SW1 is ON and the switch SW2 is OFF, only the radio frequency signal in the first frequency band out of the first frequency band and the second frequency band is passed. Therefore, the bandpass characteristic of the filter 12 is the characteristic focusing on the in-band insertion loss for improving the bandpass characteristic of the filter 12 without necessarily consideration of the bandpass characteristic of the filter 20.

When the switch SW1 is OFF and the switch SW2 is ON, the radio frequency signals in the first frequency band and the second frequency band are passed simultaneously. Therefore, the bandpass characteristic of the filter 12 is the characteristic focusing on the out-of-band attenuation for greatly securing the attenuation in the second frequency band and reducing the in-band insertion loss of the filter 20.

Fourth Embodiment

A multiplexer according to this embodiment has a structure in which a series arm circuit and parallel arm circuits are further added to the multiplexer 1 according to the first embodiment. The structure of the multiplexer according to this embodiment is similar to the structure of the multiplexer 1 illustrated in FIG. 1 and therefore description is omitted hereinafter. The circuit structure and the bandpass characteristic of the first filter are mainly described.

[4.1 Circuit Structure of Filter 13 (First Filter)]

Figure 8A:
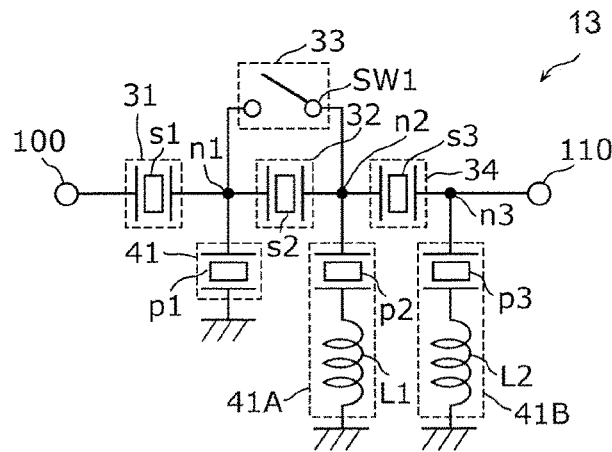
FIG. 8A is a circuit structure diagram illustrating the case in which the first switch of the first filter is OFF according to a fourth embodiment.
Figure 8B:
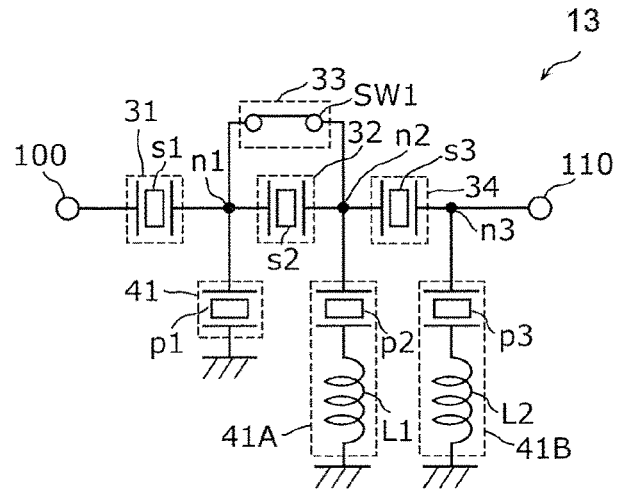
FIG. 8B is a circuit structure diagram illustrating the case in which the first switch of the first filter is ON according to the fourth embodiment.

FIG. 8A is a circuit structure diagram illustrating a case in which the switch SW1 of a filter 13 is OFF according to the fourth embodiment. FIG. 8B is a circuit structure diagram illustrating a case in which the switch SW1 of the filter 13 is ON according to the fourth embodiment.

As illustrated in FIG. 8A and FIG. 8B, the filter 13 includes series arm circuits 31, 32, 33, and 34 and parallel arm circuits 41, 41A, and 41B. The filter 13 according to this embodiment differs from the filter 10 according to the first embodiment only in that the parallel arm circuits 41A and 41B and the series arm circuit 34 are added. Description of the features of the filter 13 that are identical to those of the filter 10 is omitted and the different feature is mainly described below.

The series arm circuit 34 is a series arm circuit connected between the common terminal 100 and the input/output terminal 110 and includes a series arm resonator s3 that is an acoustic wave resonator having an input terminal and an output terminal connected on the first path connecting the common terminal 100 and the input/output terminal 110.

The parallel arm circuit 41A includes the parallel arm resonator p2 that is the acoustic wave resonator connected between the node n2 and the ground, and the inductor L1 connected to the parallel arm resonator p2. The parallel arm resonator p2 and the inductor L1 are connected in series between the node n2 and the ground.

The parallel arm circuit 41B includes a parallel arm resonator p3 that is an acoustic wave resonator connected between a node n3 and the ground, and an inductor L2 connected to the parallel arm resonator p3. The parallel arm resonator p3 and the inductor L2 are connected in series between the node n3 and the ground.

In the circuit structure described above, when the filters 13 and 20 are operated simultaneously (CA mode), the controller brings the switch SW1 into the non-conductive state. When only the filter 13 out of the filters 13 and 20 is operated (non-CA mode), the controller brings the switch SW1 into the conductive state. That is, in the multiplexer according to this embodiment, when the radio frequency signals in the first frequency band and the second frequency band are passed simultaneously, the switch SW1 is in the non-conductive state and, when only the radio frequency signal in the first frequency band out of the first frequency band and the second frequency band is passed, the switch SW1 is in the conductive state.

According to the structure described above, when the radio frequency signals in the first frequency band and the second frequency band are passed simultaneously (CA mode), the radio frequency signal in the first frequency band passes through the filter 13 without necessarily passing through the switch SW1. Therefore, a switch loss of the filter 13 can be reduced. At this time, the resonant frequencies of the parallel arm circuits can be varied by the parallel arm circuits 41A and 41B and the attenuation and the attenuation band width of the filter 13 in the second frequency band can be adjusted with high accuracy. Therefore, the in-band insertion loss of the filter 20 can be reduced. More specifically, the inductance values of the inductor L1 of the parallel arm circuit 41A and the inductor L2 of the parallel arm circuit 41B are adjusted to adjust the resonant frequencies of the parallel arm circuits 41A and 41B. Thus, the attenuation characteristic of the filter 13 can be adjusted with high accuracy.

When only the radio frequency signal in the first frequency band out of the first frequency band and the second frequency band is passed, the series arm circuit 32 is bypassed by conduction of the switch SW1. Therefore, the impedance of the parallel combination circuit of the series arm circuits 32 and 33 is reduced. Thus, a radio frequency propagation loss in a main path of the filter 13 can be reduced. Accordingly, the radio frequency propagation loss can be reduced while reducing the switch loss of the multiplexer according to this embodiment.

[4.2 Bandpass Characteristics of Multiplexer]

Figure 9:
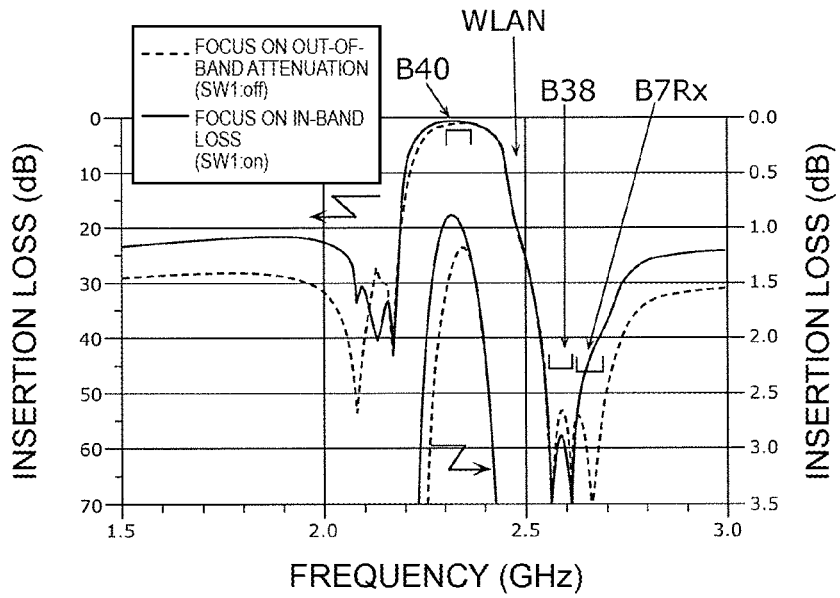
FIG. 9 is a graph illustrating comparison of bandpass characteristics between the case in which the first switch of the first filter is ON and the case in which the first switch of the first filter is OFF according to the fourth embodiment.

FIG. 9 is a graph illustrating comparison of the bandpass characteristics between the case in which the switch SW1 of the filter 13 is ON and the case in which the switch SW1 of the filter 13 is OFF according to the fourth embodiment.

As described above, when the switch SW1 is ON, only the radio frequency signal in the first frequency band out of the first frequency band and the second frequency band is passed. Therefore, the bandpass characteristic of the filter 13 is the characteristic focusing on the in-band insertion loss for improving the bandpass characteristic of the filter 13 without necessarily consideration of the bandpass characteristic of the filter 20.

When the switch SW1 is OFF, the radio frequency signals in the first frequency band and the second frequency band are passed simultaneously. Therefore, the bandpass characteristic of the filter 13 is the characteristic focusing on the out-of-band attenuation for widely securing the attenuation in the second frequency band and reducing the in-band insertion loss of the filter 20. For example, when the switch SW1 is turned OFF into the CA mode in which the radio frequency signals in the first frequency band and the second frequency band are passed simultaneously, attenuation can be achieved simultaneously in bands corresponding to a plurality of bands such as LTE Band 38 (2570 to 2620 MHz), Band 7 Rx (2620 to 2690 MHz), and WLAN (2440 to 2495 MHz) by adjusting the resonant frequencies of the parallel arm circuits 41A and 41B.

[4.3 Structure of Radio Frequency Circuit 3A]

Figure 10A:
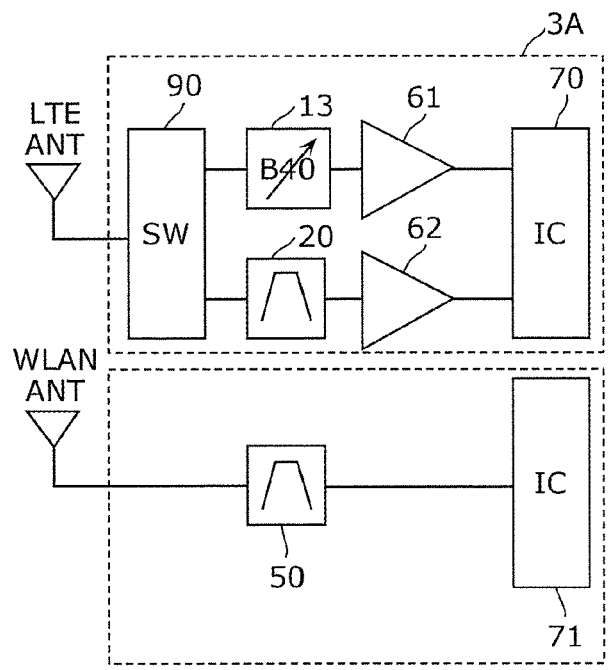
FIG. 10A is a structural diagram of a radio frequency circuit including the first filter and its peripheral circuit according to the fourth embodiment.
Figure 10B:
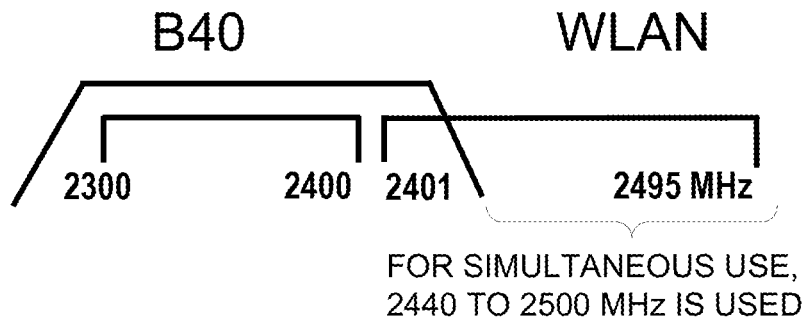
FIG. 10B is a diagram illustrating an example of band application of the radio frequency circuit according to the fourth embodiment.

FIG. 10A is a structural diagram of a radio frequency circuit 3A including the filter 13 and its peripheral circuit according to the fourth embodiment. FIG. 10B is a diagram illustrating an example of band application of the radio frequency circuit according to the fourth embodiment. FIG. 10A illustrates the radio frequency circuit 3A configured to process radio frequency signals of LTE, a radio frequency circuit configured to process radio frequency signals of WLAN, an LTE antenna element, and a WLAN antenna element. For example, the two radio frequency circuits and the two antenna elements are arranged at the front end portion of one mobile terminal.

The radio frequency circuit 3A includes the filters 13 and 20, the reception amplification circuits 61 and 62, the RFIC 70, and a switch 90. The radio frequency circuit configured to process radio frequency signals of WLAN includes a filter 50 and an RFIC 71.

In the structure described above, for example, (1) a CA operation of Band 40 and Band 38, (2) a CA operation of Band 40 and Band 7 Rx, (3) a non-CA operation of Band 40, (4) a non-CA operation of Band 38, or (5) a non-CA operation of Band 7 Rx is selected. WLAN operates optionally irrespective of the selection among (1) to (5) and WLAN may be omitted. Even if the selection is made from among (1) to (5), by applying the multiplexer including the filter 13 according to this embodiment, a radio frequency signal in Band 40 passes through the filter 13 without necessarily passing through the switch SW1 when (1) or (2) is selected (CA mode). Therefore, the switch loss of the filter 13 can be reduced. At this time, the resonant frequencies of the parallel arm circuits can be varied by the parallel arm circuits 41A and 41B and the attenuation and the attenuation band width of the filter 13 in Band 38, Band 7 Rx, and a WLAN band can be adjusted with high accuracy. Therefore, the in-band insertion loss of the filter 20 can be reduced. When one of (3) to (5) is selected (non-CA mode), the series arm circuit 32 is bypassed by conduction of the switch SW1. Therefore, the impedance of the parallel combination circuit of the series arm circuits 32 and 33 is reduced. Thus, the radio frequency propagation loss in Band 40 can be reduced. Accordingly, the radio frequency propagation loss can be reduced while reducing the switch loss of the radio frequency circuit 3A according to this embodiment. At this time, attenuation in the WLAN band can be achieved even in the non-CA mode if the system uses WLAN in combination. Thus, it is possible to reduce the occurrence of a case in which reception sensitivity decreases due to interference between the radio frequency signal in Band 40 and a radio frequency signal in the WLAN band.

The switch 90 may be omitted depending on the selection structure for Band 7 Rx and Band 38.

Fifth Embodiment

A multiplexer according to this embodiment differs from the multiplexer according to the fourth embodiment in terms of the structures of the second series arm circuit and the second parallel arm circuit. The structure of the multiplexer according to this embodiment is similar to the structure of the multiplexer 1 illustrated in FIG. 1 and therefore description is omitted hereinafter. The circuit structure and the bandpass characteristic of the first filter are mainly described.

[5.1 Circuit Structure of Filter 14 (First Filter)]

Figure 11A:
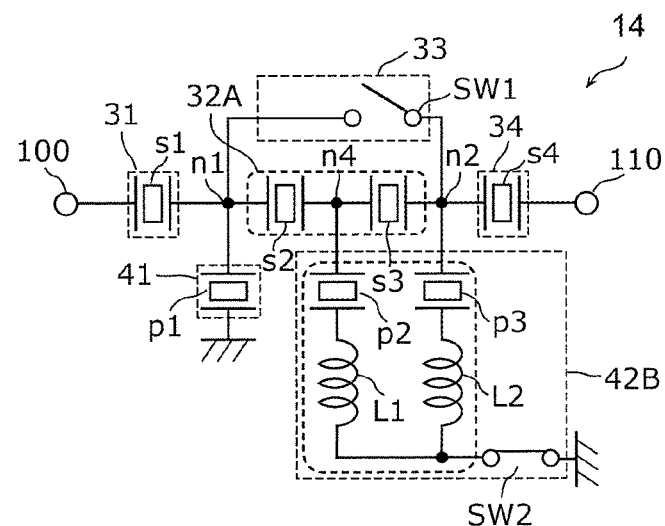
FIG. 11A is a circuit structure diagram illustrating the case in which the first switch is OFF and the second switch is ON in the first filter according to a fifth embodiment.
Figure 11B:
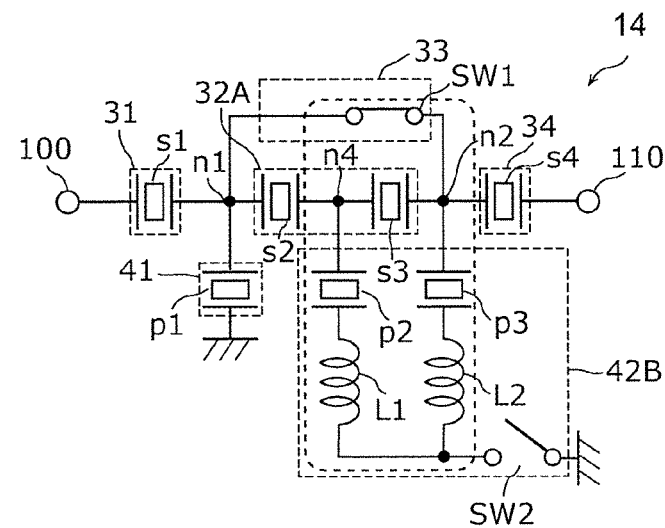
FIG. 11B is a circuit structure diagram illustrating the case in which the first switch is ON and the second switch is OFF in the first filter according to the fifth embodiment.

FIG. 11A is a circuit structure diagram illustrating a case in which the switch SW1 is OFF and the switch SW2 is ON in a filter 14 according to the fifth embodiment. FIG. 11B is a circuit structure diagram illustrating a case in which the switch SW1 is ON and the switch SW2 is OFF in the filter 14 according to the fifth embodiment.

As illustrated in FIG. 11A and FIG. 11B, the filter 14 includes series arm circuits 31, 32A, 33, and 34 and parallel arm circuits 41 and 42B. The filter 14 according to this embodiment differs from the filter 13 according to the fourth embodiment in terms of the circuit structures of the series arm circuit 32A and the parallel arm circuit 42B. Description of the features of the filter 14 that are identical to those of the filter 13 is omitted and the different feature is mainly described below.

The series arm circuit 32A is the second series arm circuit connected between the common terminal 100 and the input/output terminal 110 and includes the series arm resonator s2 (first series arm resonator) and the series arm resonator s3 that are the acoustic wave resonators connected in series on the first path connecting the common terminal 100 and the input/output terminal 110.

The parallel arm circuit 42B is the second parallel arm circuit connected between the node n2 and the ground. The parallel arm circuit 42B includes the parallel arm resonators p2 and p3 that are the acoustic wave resonators, the inductor L1 connected to the parallel arm resonator p2, the inductor L2 connected to the parallel arm resonator p3, and the switch SW2. The switch SW2 is connected between the ground and a connection point of the inductors L1 and L2. The parallel arm resonator p3 is the first parallel arm resonator connected between the node n2 and the ground. The parallel arm resonator p2 is a parallel arm resonator connected between the ground and a node n4 connecting the series arm resonators s2 and s3.

In the circuit structure described above, when the filters 14 and 20 are operated simultaneously (CA mode), the controller brings the switch SW1 into the non-conductive state and the switch SW2 into the conductive state. When only the filter 14 out of the filters 14 and 20 is operated (non-CA mode), the controller brings the switch SW1 into the conductive state and the switch SW2 into the non-conductive state. That is, in the multiplexer according to this embodiment, when the radio frequency signals in the first frequency band and the second frequency band are passed simultaneously, the switch SW1 is in the non-conductive state and the switch SW2 is in the conductive state and, when only the radio frequency signal in the first frequency band out of the first frequency band and the second frequency band is passed, the switch SW1 is in the conductive state and the switch SW2 is in the non-conductive state.

According to the structure described above, when the radio frequency signals in the first frequency band and the second frequency band are passed simultaneously (CA mode), the radio frequency signal in the first frequency band passes through the filter 14 without necessarily passing through the switch SW1. Therefore, a switch loss of the filter 14 can be reduced. At this time, the resonant frequency and the anti-resonant frequency of the series arm circuit 32A can be adjusted by the series arm resonators s2 and s3 of the series arm circuit 32A and attenuation of the filter 14 in the second frequency band can be adjusted with high accuracy. Therefore, the in-band insertion loss of the filter 20 can be reduced. More specifically, the resonant frequencies and the anti-resonant frequencies of the series arm resonators s2 and s3 are varied and therefore the attenuation characteristic and the band width of the filter 14 can be adjusted with high accuracy.

Further, the parallel arm circuit 42B is caused to function by conduction of the switch SW2. Therefore, the attenuation characteristic in the vicinity of the pass band can be enhanced without necessarily causing the radio frequency propagation loss in the main path (first path) due to the conduction of the switch SW2. At this time, the resonant frequency of the parallel arm circuit 42B can be adjusted by the inductors L1 and L2 and the attenuation of the filter 14 in the second frequency band can be adjusted with high accuracy. Therefore, the in-band insertion loss of the filter 20 can be reduced. More specifically, the inductance values of the inductors L1 and L2 of the parallel arm circuit 42B are adjusted to adjust the resonant frequency of the parallel arm circuit 42B. Thus, the attenuation characteristic of the filter 14 can be adjusted with high accuracy.

When only the radio frequency signal in the first frequency band out of the first frequency band and the second frequency band is passed, the series arm circuit 32 is bypassed by conduction of the switch SW1. Therefore, the impedance of the parallel combination circuit of the series arm circuits 32 and 33 is reduced. Thus, the radio frequency propagation loss in the main path of the filter 14 can be reduced. Accordingly, the radio frequency propagation loss can be reduced while reducing the switch loss of the multiplexer according to this embodiment. Further, a combined admittance of the parallel arm circuit 42B in the first frequency band is reduced by bringing the switch SW2 into non-conduction. Therefore, an insertion loss in the pass band of the filter 14 can be reduced without necessarily causing the radio frequency propagation loss in the main path (first path) due to the non-conduction of the switch SW2. Thus, the radio frequency propagation loss can be reduced while reducing the switch loss of the multiplexer.

[5.2 Bandpass Characteristics of Multiplexer]

Figure 12:
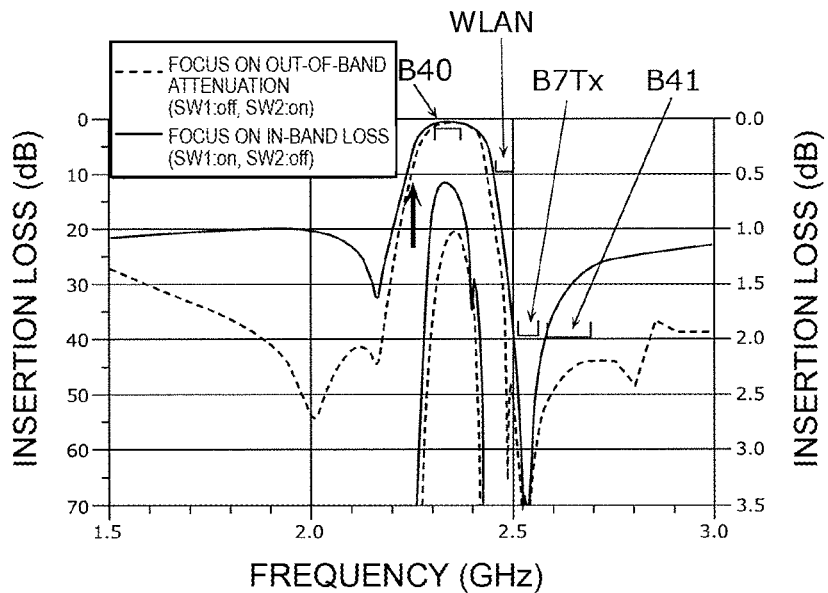
FIG. 12 is a graph illustrating comparison of bandpass characteristics between the case in which the first switch is ON and the second switch is OFF and the case in which the first switch is OFF and the second switch is ON in the first filter according to the fifth embodiment.

FIG. 12 is a graph illustrating comparison of the bandpass characteristics between the case in which the switch SW1 is ON and the switch SW2 is OFF and the case in which the switch SW1 is OFF and the switch SW2 is ON in the filter 14 according to the fifth embodiment.

As described above, when the switch SW1 is ON and the switch SW2 is OFF, only the radio frequency signal in the first frequency band out of the first frequency band and the second frequency band is passed. Therefore, the bandpass characteristic of the filter 14 is the characteristic focusing on the in-band insertion loss for improving the bandpass characteristic of the filter 14 without necessarily consideration of the bandpass characteristic of the filter 20. Improvement is particularly observed in terms of the insertion loss on a lower side of the pass band.

When the switch SW1 is OFF and the switch SW2 is ON, the radio frequency signals in the first frequency band and the second frequency band are passed simultaneously. Therefore, the bandpass characteristic of the filter 14 is the characteristic focusing on the out-of-band attenuation for widely securing the attenuation in the second frequency band and reducing the in-band insertion loss of the filter 20. For example, when the switch SW1 is turned OFF and the switch SW2 is turned ON into the CA mode in which the radio frequency signals in the first frequency band and the second frequency band are passed simultaneously, attenuation can be achieved simultaneously in bands corresponding to a plurality of bands such as LTE Band 41 (2496 to 2690 MHz), Band 7 Tx (2500 to 2570 MHz), and WLAN (2440 to 2495 MHz) by adjusting the resonant frequency of the parallel arm circuit 42B.

[5.3 Bandpass Characteristics of Multiplexer 15 According to First Modified Example]

Figure 13:
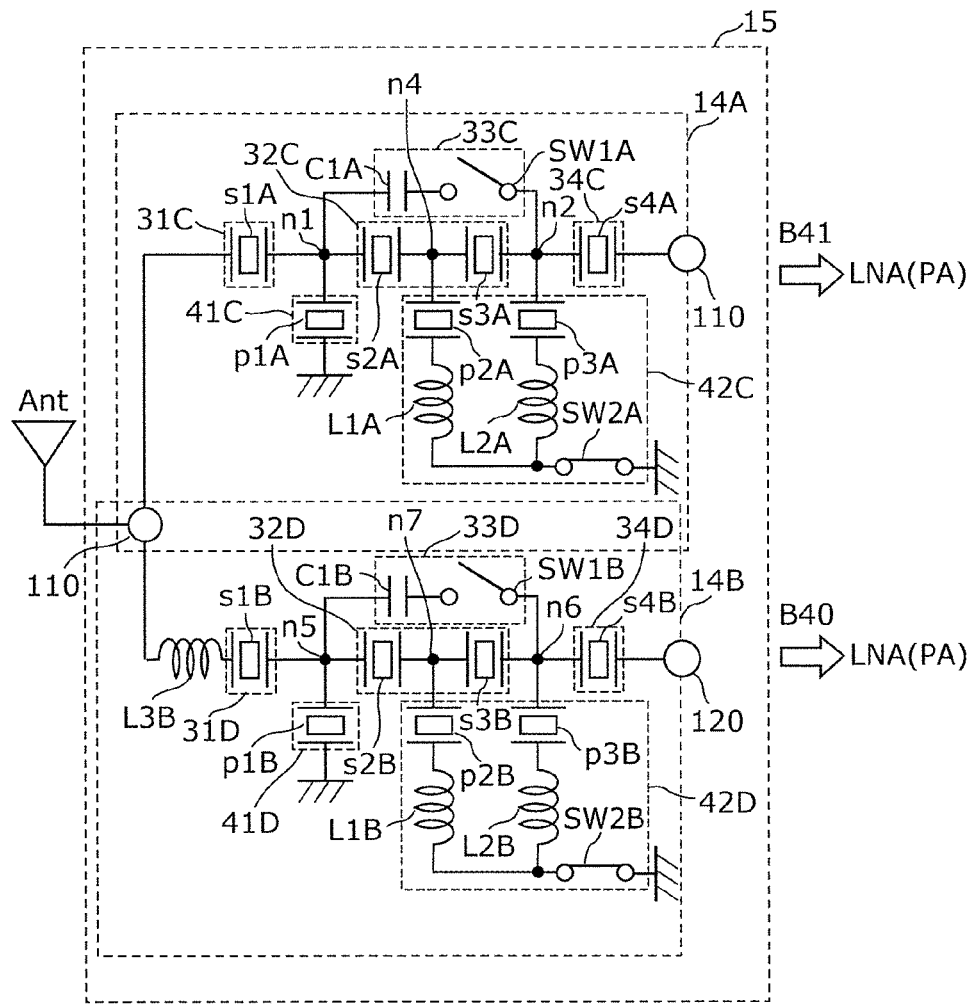
FIG. 13 is a circuit structure diagram of a multiplexer according to a first modified example of the fifth embodiment.

FIG. 13 is a circuit structure diagram of a multiplexer 15 according to a first modified example of the fifth embodiment. The multiplexer 15 according to this modified example differs from the multiplexer according to the fifth embodiment in terms of a structure in which two filters that constitute the multiplexer both include switches. The multiplexer 15 includes the common terminal 100, the input/ output terminal 110 (first input/output terminal), the input/output terminal 120 (second input/output terminal), a filter 14A, and a filter 14B.

This modified example is an example in which the filter 14A is applied to, for example, LTE Band 41 (2496 to 2690 MHz) and the filter 14B is applied to, for example, LTE Band 40 (2300 to 2400 MHz).

The filter 14A is an acoustic wave filter whose pass band (second frequency band) is LTE Band 41 and includes series arm circuits 31C, 32C, 33C, and 34C and parallel arm circuits 41C and 42C. The filter 14A according to this modified example differs from the filter 14 according to the fifth embodiment only in terms of the circuit structure of the series arm circuit 33C. Description of the features of the filter 14A that are identical to those of the filter 14 is omitted and the different feature is mainly described below.

The series arm circuit 31C includes a series arm resonator s1A having an input terminal and an output terminal connected on the first path. The series arm circuit 32C includes series arm resonators s2A and s3A connected in series on the first path. The series arm circuit 34C includes a series arm resonator s4A having an input terminal and an output terminal connected on the first path.

The series arm circuit 33C includes a switch SW1A (first switch) and a capacitor C1A (impedance element) connected in series on the second path connecting the two nodes n1 and n2 where the series arm circuit 32C and the series arm circuit 33C are connected in parallel.

The parallel arm circuit 41C includes a parallel arm resonator p1A connected between the node n1 and the ground. The parallel arm circuit 42C includes parallel arm resonators p2A and p3A, an inductor L1A connected to the parallel arm resonator p2A, an inductor L2A connected to the parallel arm resonator p3A, and a switch SW2A. The switch SW2A is connected between the ground and a connection point of the inductors L1A and L2A. The parallel arm resonator p3A is connected between the node n2 and the ground. The parallel arm resonator p2A is connected between the ground and the node n4 connecting the series arm resonators s2A and s3A.

The filter 14B is an acoustic wave filter whose pass band (first frequency band) is LTE Band 40 and includes an inductor L3B, series arm circuits 31D, 32D, 33D, and 34D, and parallel arm circuits 41D and 42D. The filter 14B according to this modified example differs from the filter 14 according to the fifth embodiment only in that the inductor L3B is added and in terms of the circuit structure of the series arm circuit 33D. Description of the features of the filter 14B that are identical to those of the filter 14 is omitted and the different feature is mainly described below.

The series arm circuit 31D includes a series arm resonator s1B having an input terminal and an output terminal connected on the first path. The series arm circuit 32D includes series arm resonators s2B and s3B connected in series on the first path. The series arm circuit 34D includes a series arm resonator s4B having an input terminal and an output terminal connected on the first path.

The series arm circuit 33D includes a switch SW1B (first switch) and a capacitor C1B (impedance element) connected in series on the second path connecting two nodes n5 and n6 where the series arm circuit 32D and the series arm circuit 33D are connected in parallel.

The parallel arm circuit 41D includes a parallel arm resonator p1B connected between the node n5 and the ground. The parallel arm circuit 42D includes parallel arm resonators p2B and p3B, an inductor L1B connected to the parallel arm resonator p2B, an inductor L2B connected to the parallel arm resonator p3B, and a switch SW2B. The switch SW2B is connected between the ground and a connection point of the inductors L1B and L2B. The parallel arm resonator p3B is connected between the node n6 and the ground. The parallel arm resonator p2B is connected between the ground and a node n7 connecting the series arm resonators s2B and s3B.

In the circuit structure described above, when the filters 14A and 14B are operated simultaneously (CA mode), the controller brings the switches SW1A and SW1B into the non-conductive state and the switches SW2A and SW2B into the conductive state. When only the filter 14A out of the filters 14A and 14B is operated (non-CA mode), the controller brings the switch SW1A into the conductive state and the switch SW2A into the non-conductive state and brings the switch SW1B into the non-conductive state and the switch SW2B into the conductive state. When only the filter 14B out of the filters 14A and 14B is operated (non-CA mode), the controller brings the switch SW1B into the conductive state and the switch SW2B into the non-conductive state and brings the switch SW1A into the non-conductive state and the switch SW2A into the conductive state.

That is, in the multiplexer 15 according to this modified example, when the radio frequency signals in the first frequency band (Band 40) and the second frequency band (Band 41) are passed simultaneously, the switches SW1A and SW1B are in the non-conductive state and the switches SW2A and SW2B are in the conductive state. When only the radio frequency signal in the first frequency band (Band 40) out of the first frequency band (Band 40) and the second frequency band (Band 41) is passed, the switch SW1A is in the conductive state, the switch SW2A is in the non-conductive state, the switch SW1B is in the non-conductive state, and the switch SW2B is in the conductive state. When only the radio frequency signal in the second frequency band (Band 41) out of the first frequency band (Band 40) and the second frequency band (Band 41) is passed, the switch SW1B is in the conductive state, the switch SW2B is in the non-conductive state, the switch SW1A is in the non-conductive state, and the switch SW2A is in the conductive state.

According to the structure described above, when the radio frequency signals in the first frequency band (Band 40) and the second frequency band (Band 41) are passed simultaneously (CA mode), the radio frequency signals in the first frequency band and the second frequency band pass through the filters 14A and 14B without necessarily passing through the switches SW1A and SW1B. Therefore, switch losses of the filters 14A and 14B can be reduced. At this time, the resonant frequencies and the anti-resonant frequencies of the series arm circuits 32C and 32D can be adjusted by the series arm resonators s2A, s2B, s3A, and s3B of the series arm circuits 32C and 32D and attenuation of the filter 14A in the first frequency band and attenuation of the filter 14B in the second frequency band can be adjusted with high accuracy. Therefore, in-band insertion losses of the filters 14A and 14B can be reduced mutually.

Further, the parallel arm circuits 42C and 42D are caused to function by conduction of the switches SW2A and SW2B. Therefore, attenuation characteristics in the vicinity of the pass bands can be enhanced without necessarily causing radio frequency propagation losses in main paths (first paths) due to the conduction of the switches SW2A and SW2B. At this time, the resonant frequencies of the parallel arm circuits 42C and 42D can be adjusted by the inductors L1A, L1B, L2A, and L2B and the attenuation of the filter 14A in the first frequency band and the attenuation of the filter 14B in the second frequency band can be adjusted with high accuracy. Therefore, the in-band insertion losses of the filters 14A and 14B can be reduced mutually.

When only the radio frequency signal in the first frequency band (Band 40) out of the first frequency band (Band 40) and the second frequency band (Band 41) is passed, the series arm circuit 32C is bypassed by conduction of the switch SW1A. Therefore, the impedance of a parallel combination circuit of the series arm circuits 32C and 33C is reduced. Thus, the radio frequency propagation loss in the main path of the filter 14A can be reduced. At this time, impedance mismatching in the main path due to the bypassing can be avoided by arranging the capacitor C1A. When only the radio frequency signal in the second frequency band (Band 41) out of the first frequency band (Band 40) and the second frequency band (Band 41) is passed, the series arm circuit 32D is bypassed by conduction of the switch SW1B. Therefore, the impedance of a parallel combination circuit of the series arm circuits 32D and 33D is reduced. Thus, the radio frequency propagation loss in the main path of the filter 14B can be reduced. At this time, impedance mismatching in the main path due to the bypassing can be avoided by arranging the capacitor C1B.

Accordingly, the radio frequency propagation loss can be reduced while reducing the switch loss of the multiplexer 15 according to this modified example. Further, a combined admittance of the parallel arm circuit 42C in the second frequency band is reduced by bringing the switch SW2A into non-conduction and a combined admittance of the parallel arm circuit 42D in the first frequency band is reduced by bringing the switch SW2B into non-conduction. Therefore, insertion losses in the pass bands of the filters 14A and 14B can be reduced without necessarily causing radio frequency propagation losses in the main paths (first paths) due to the non-conduction of the switches SW2A and SW2B. Thus, the radio frequency propagation loss can be reduced while reducing the switch loss of the multiplexer 15.

[5.4 Bandpass Characteristics of Multiplexer 15]

Figure 14:
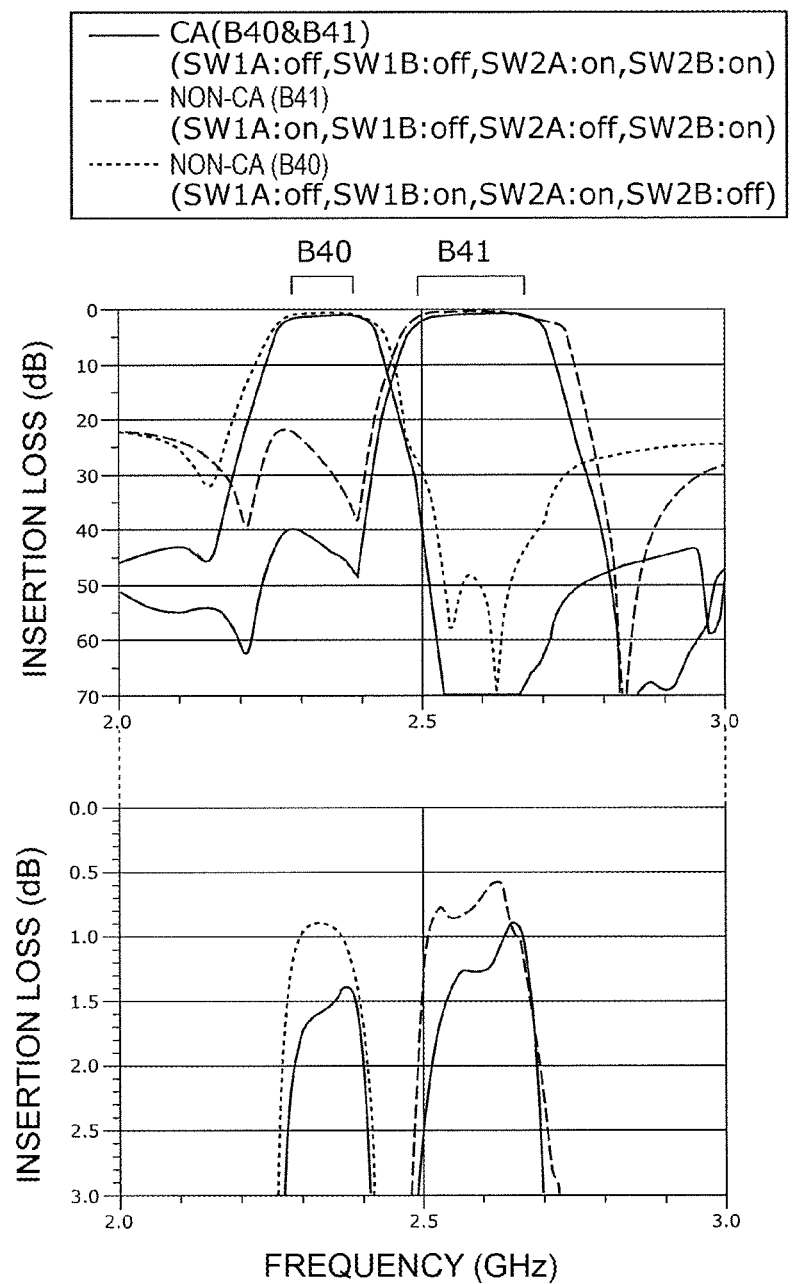
FIG. 14 is a graph illustrating bandpass characteristics in a CA mode and a non-CA mode in the multiplexer according to the first modified example of the fifth embodiment.

FIG. 14 is a graph illustrating bandpass characteristics in the CA mode and the non-CA mode in the multiplexer 15 according to the first modified example of the fifth embodiment.

As described above, when only the first frequency band (Band 40) is selected (non-CA (B40)), the bandpass characteristic of the filter 14B is the characteristic focusing on the in-band insertion loss for improving the bandpass characteristic of the filter 14B without necessarily consideration of the bandpass characteristic of the filter 14A. When only the second frequency band (Band 41) is selected (non-CA (B41)), the bandpass characteristic of the filter 14A is the characteristic focusing on the in-band insertion loss for improving the bandpass characteristic of the filter 14A without necessarily consideration of the bandpass characteristic of the filter 14B.

When the first frequency band (Band 40) and the second frequency band (Band 41) are selected simultaneously (CA (B40 & B41)), the bandpass characteristic of the filter 14B is the characteristic focusing on the out-of-band attenuation for widely securing the attenuation in the second frequency band and reducing the in-band insertion loss of the filter 14A and the bandpass characteristic of the filter 14A is the characteristic focusing on the out-of-band attenuation for widely securing the attenuation in the first frequency band and reducing the in-band insertion loss of the filter 14B.

[5.5 Structure of Radio Frequency Circuit 3B]

Figure 15:
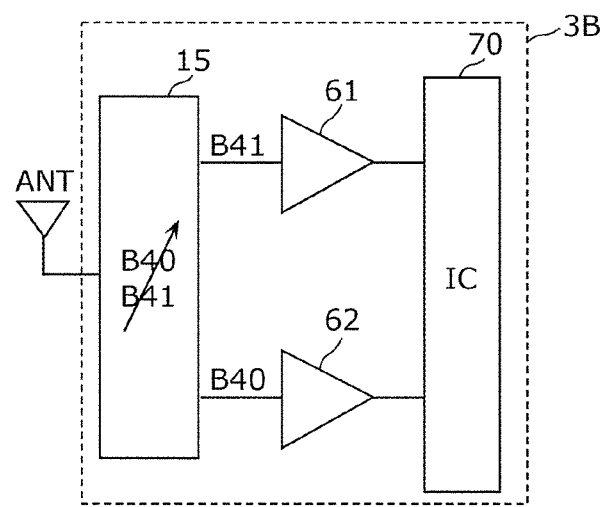
FIG. 15 is a structural diagram of a radio frequency circuit according to the first modified example of the fifth embodiment.

FIG. 15 is a structural diagram of a radio frequency circuit 3B according to the first modified example of the fifth embodiment. FIG. 15 illustrates the radio frequency circuit 3B configured to process the radio frequency signals in LTE Band 40 and Band 41, and an LTE antenna element. The radio frequency circuit 3B and the LTE antenna element are arranged at the front end portion of one mobile terminal.

The radio frequency circuit 3B includes the multiplexer 15, the reception amplification circuits 61 and 62, and the RFIC 70.

In the structure described above, for example, (1) a CA operation of Band 40 and Band 41, (2) a non-CA operation of Band 40, or (3) a non-CA operation of Band 41 is selected. According to the radio frequency circuit 3B including the multiplexer 15 according to this modified example, the radio frequency signals in Band 40 and Band 41 pass through the filters 14A and 14B without necessarily passing through the switches SW1A and SW1B when (1) is selected (CA mode). Therefore, the switch losses of the filters 14A and 14B can be reduced. At this time, the resonant frequencies of the parallel arm circuits can be varied by the parallel arm circuits 42C and 42D and the attenuation and the attenuation band width of the filter 14A in Band 40 and the attenuation and the attenuation band width of the filter 14B in Band 41 can be adjusted with high accuracy. Therefore, the in-band insertion losses of the filters 14B and 14A can be reduced. When (2) or (3) is selected (non-CA mode), the series arm circuit 32C or 32D is bypassed by conduction of the switch SW1A or SW1B. Therefore, the impedance of the parallel combination circuit of the series arm circuits 32C and 33C or the parallel combination circuit of the series arm circuits 32D and 33D is reduced. Thus, the radio frequency propagation loss in Band 40 or Band 41 can be reduced. Accordingly, the radio frequency propagation loss can be reduced while reducing the switch loss of the radio frequency circuit 3B according to this modified example.

[5.6 Structure of Multiplexer 16]

Figure 16:
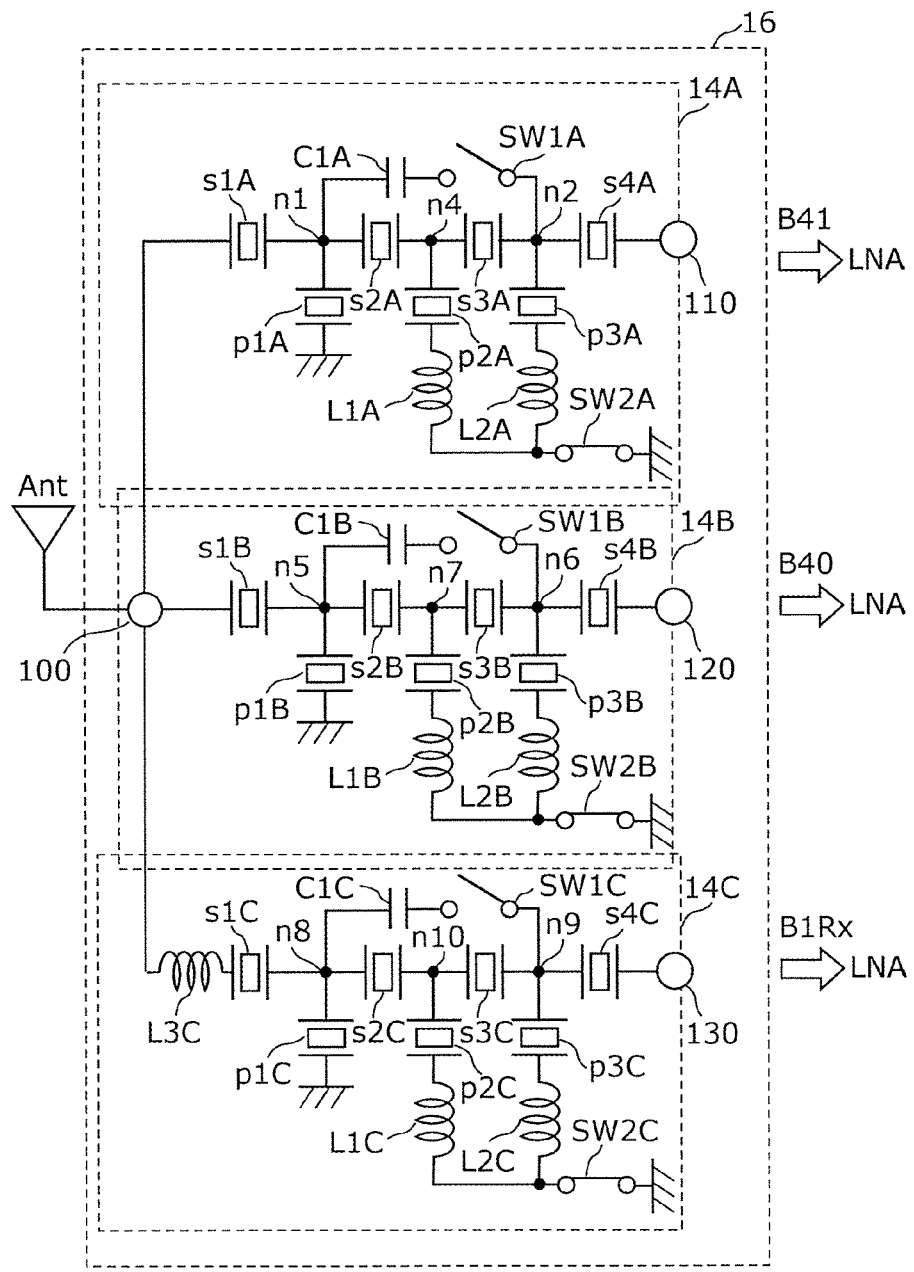
FIG. 16 is a circuit structure diagram of a multiplexer according to a second modified example of the fifth embodiment.

FIG. 16 is a circuit structure diagram of a multiplexer 16 according to a second modified example of the fifth embodiment. The multiplexer 16 according to this modified example differs from the multiplexer according to the fifth embodiment in terms of a structure in which three filters that constitute the multiplexer all include switches. The multiplexer 16 includes the common terminal 100, the input/output terminal 110 (first input/output terminal), the input/output terminal 120 (second input/output terminal), an input/output terminal 130, the filter 14A, the filter 14B, and a filter 14C.

This modified example is an example in which the filter 14A is applied to, for example, LTE Band 41 (2496 to 2690 MHz), the filter 14B is applied to, for example, LTE Band 40 (2300 to 2400 MHz), and the filter 14C is applied to, for example, LTE Band 1 Rx (2110 to 2170 MHz).

The filter 14A is the acoustic wave filter whose pass band (second frequency band) is LTE Band 41 and has the same circuit structure as the filter 14A that constitutes the multiplexer 15.

The filter 14B is the acoustic wave filter whose pass band (first frequency band) is LTE Band 40 and has the same circuit structure as the filter 14B that constitutes the multiplexer 15 (structure of the filter 14B without necessarily the inductor L3B).

The filter 14C is an acoustic wave filter whose pass band is LTE Band 1 Rx and has the same circuit structure as the filter 14B that constitutes the multiplexer 15.

In the circuit structure described above, when the filters 14A, 14B, and 14C are operated simultaneously (CA mode), the controller brings switches SW1A, SW1B, and SW1C into the non-conductive state and switches SW2A, SW2B, and SW2C into the conductive state. When only the filter 14A out of the filters 14A, 14B, and 14C is operated (non-CA mode), the controller brings the switch SW1A into the conductive state and the switch SW2A into the non-conductive state, brings the switch SW1B into the non-conductive state and the switch SW2B into the conductive state, and brings the switch SW1C into the non-conductive state and the switch SW2C into the conductive state. When only the filter 14B out of the filters 14A, 14B, and 14C is operated (non-CA mode), the controller brings the switch SW1B into the conductive state and the switch SW2B into the non-conductive state, brings the switch SW1A into the non-conductive state and the switch SW2A into the conductive state, and brings the switch SW1C into the non-conductive state and the switch SW2C into the conductive state. When only the filter 14C out of the filters 14A, 14B, and 14C is operated (non-CA mode), the controller brings the switch SW1C into the conductive state and the switch SW2C into the non-conductive state, brings the switch SW1A into the non-conductive state and the switch SW2A into the conductive state, and brings the switch SW1B into the non-conductive state and the switch SW2B into the conductive state.

That is, in the multiplexer 16 according to this modified example, when radio frequency signals in Band 41, Band 40, and Band 1 Rx are passed simultaneously, the switches SW1A, SW1B, and SW1C are in the non-conductive state and the switches SW2A, SW2B, and SW2C are in the conductive state. When only the radio frequency signal in Band 41 out of Band 41, Band 40, and Band 1 Rx is passed, the switch SW1A is in the conductive state, the switch SW2A is in the non-conductive state, the switch SW1B is in the non-conductive state, the switch SW2B is in the conductive state, the switch SW1C is in the non-conductive state, and the switch SW2C is in the conductive state. When only the radio frequency signal in Band 40 out of Band 41, Band 40, and Band 1 Rx is passed, the switch SW1B is in the conductive state, the switch SW2B is in the non-conductive state, the switch SW1A is in the non-conductive state, the switch SW2A is in the conductive state, the switch SW1C is in the non-conductive state, and the switch SW2C is in the conductive state. When only the radio frequency signal in Band 1 Rx out of Band 41, Band 40, and Band 1 Rx is passed, the switch SW1C is in the conductive state, the switch SW2C is in the non-conductive state, the switch SW1A is in the non-conductive state, the switch SW2A is in the conductive state, the switch SW1B is in the non-conductive state, and the switch SW2B is in the conductive state.

According to the structure described above, when the radio frequency signals in Band 41, Band 40, and Band 1 Rx are passed simultaneously (CA mode), the radio frequency signals in Band 41, Band 40, and Band 1 Rx pass through the filters 14A, 14B, and 14C without necessarily passing through the switches SW1A, SW1B, and SW1C. Therefore, switch losses of the filters 14A, 14B, and 14C can be reduced. At this time, the resonant frequencies and the anti-resonant frequencies of the second series arm circuits can be adjusted by series arm resonators s2A, s2B, s2C, s3A, s3B, and s3C of the second series arm circuits and attenuation of the filter 14A in Band 40 and Band 1 Rx, attenuation of the filter 14B in Band 41 and Band 1 Rx, and attenuation of the filter 14C in Band 41 and Band 40 can be adjusted with high accuracy. Therefore, in-band insertion losses of the filters 14A, 14B, and 14C can be reduced mutually.

Further, the second parallel arm circuits are caused to function by conduction of the switches SW2A, SW2B, and SW2C. Therefore, attenuation characteristics in the vicinity of the pass bands can be enhanced without necessarily causing radio frequency propagation losses in main paths (first paths) due to the conduction of the switches SW2A, SW2B, and SW2C. At this time, the resonant frequencies of the second parallel arm circuits can be adjusted by inductors L1A, L1B, L1C, L2A, L2B, and L2C and the attenuation of the filter 14A in Band 40 and Band 1 Rx, the attenuation of the filter 14B in Band 41 and Band 1 Rx, and the attenuation of the filter 14C in Band 41 and Band 40 can be adjusted with high accuracy. Therefore, the in-band insertion losses of the filters 14A, 14B, and 14C can be reduced mutually.

When only the radio frequency signal in Band 41 out of Band 41, Band 40, and Band 1 Rx is passed, the second series arm circuit is bypassed by conduction of the switch SW1A. Therefore, the impedance of the parallel combination circuit of the second series arm circuit and the third series arm circuit is reduced. Thus, the radio frequency propagation loss in the main path of the filter 14A can be reduced. At this time, impedance mismatching in the main path due to the bypassing can be avoided by arranging the capacitor C1A. When only the radio frequency signal in Band 40 out of Band 41, Band 40, and Band 1 Rx is passed, the second series arm circuit is bypassed by conduction of the switch SW1B. Therefore, the impedance of the parallel combination circuit of the second series arm circuit and the third series arm circuit is reduced. Thus, the radio frequency propagation loss in the main path of the filter 14B can be reduced. At this time, impedance mismatching in the main path due to the bypassing can be avoided by arranging the capacitor C1B. When only the radio frequency signal in Band 1 Rx out of Band 41, Band 40, and Band 1 Rx is passed, the second series arm circuit is bypassed by conduction of the switch SW1C. Therefore, the impedance of a parallel combination circuit of the second series arm circuit and the third series arm circuit is reduced. Thus, the radio frequency propagation loss in the main path of the filter 14C can be reduced. At this time, impedance mismatching in the main path due to the bypassing can be avoided by arranging a capacitor C1C.

Accordingly, the radio frequency propagation loss can be reduced while reducing the switch loss of the multiplexer 16 according to this modified example. Further, a combined admittance in Band 41 is reduced by bringing the switch SW2A into non-conduction, a combined admittance in Band 40 is reduced by bringing the switch SW2B into non-conduction, and a combined admittance in Band 1 Rx is reduced by bringing the switch SW2C into non-conduction. Therefore, insertion losses in the pass bands of the filters 14A, 14B, and 14C can be reduced without necessarily causing radio frequency propagation losses in the main paths (first paths) due to the non-conduction of the switches SW2A, SW2B, and SW2C. Thus, the radio frequency propagation loss can be reduced while reducing the switch loss of the multiplexer 16.

[5.7 Bandpass Characteristics of Multiplexer 16]

Figure 17:
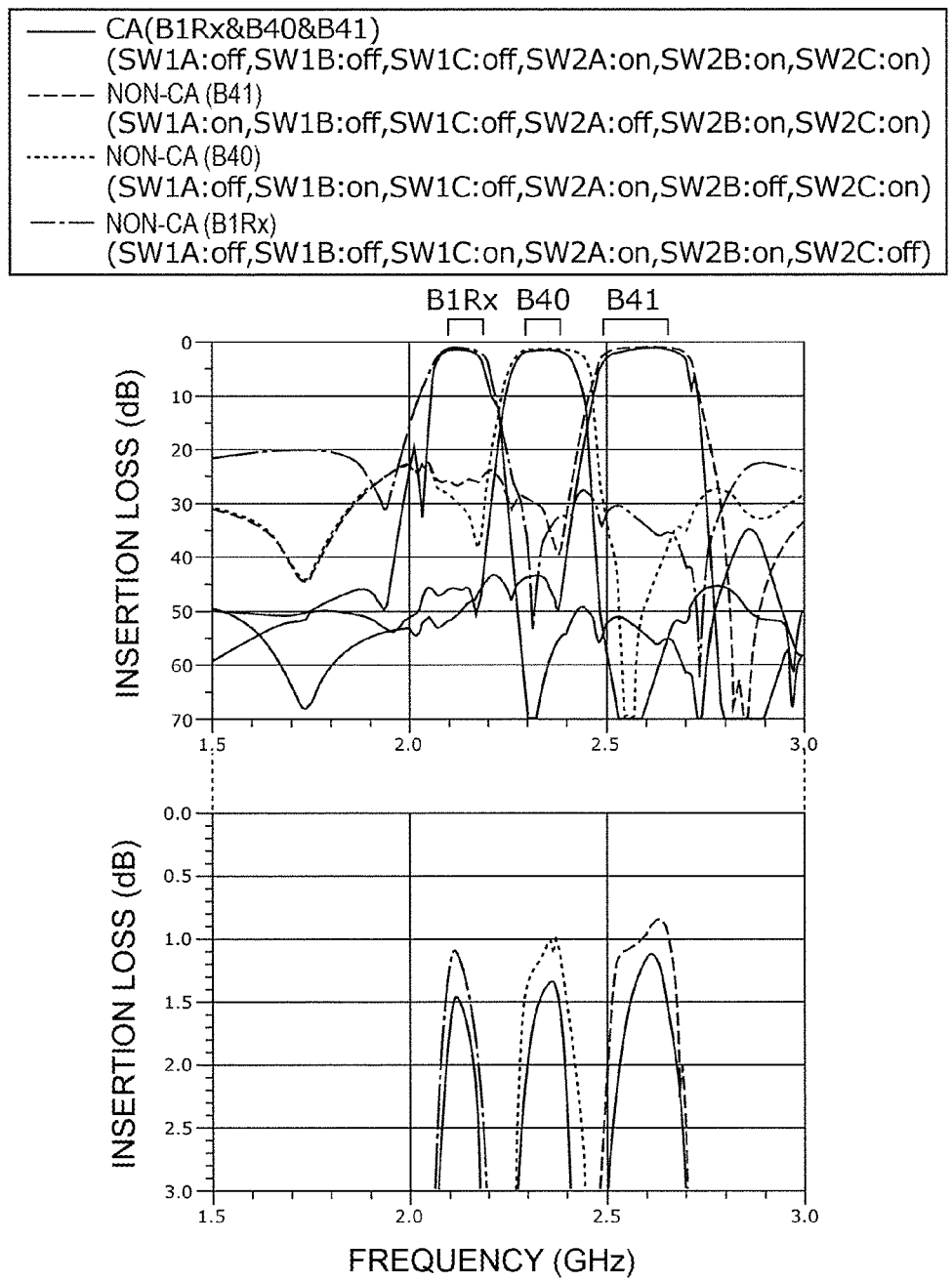
FIG. 17 is a graph illustrating bandpass characteristics in the CA mode and the non-CA mode in the multiplexer according to the second modified example of the fifth embodiment.

FIG. 17 is a graph illustrating bandpass characteristics in the CA mode and the non-CA mode in the multiplexer 16 according to the second modified example of the fifth embodiment.

As described above, when only Band 41 is selected (non-CA (B41)), the bandpass characteristic of the filter 14A is the characteristic focusing on the in-band insertion loss for improving the bandpass characteristic of the filter 14A without necessarily consideration of the bandpass characteristics of the filters 14B and 14C. When only Band 40 is selected (non-CA (B40)), the bandpass characteristic of the filter 14B is the characteristic focusing on the in-band insertion loss for improving the bandpass characteristic of the filter 14B without necessarily consideration of the bandpass characteristics of the filters 14A and 14C. When only Band 1 Rx is selected (non-CA (B1Rx)), the bandpass characteristic of the filter 14C is the characteristic focusing on the in-band insertion loss for improving the bandpass characteristic of the filter 14C without necessarily consideration of the bandpass characteristics of the filters 14A and 14B.

When Band 41, Band 40, and Band 1 Rx are selected simultaneously (CA (B1Rx & B40 & B41)), the bandpass characteristic of the filter 14A is the characteristic focusing on the out-of-band attenuation for widely securing the attenuation in Band 40 and Band 1 Rx and reducing the in-band insertion losses of the filters 14B and 14C. Further, the bandpass characteristic of the filter 14B is the characteristic focusing on the out-of-band attenuation for widely securing the attenuation in Band 41 and Band 1 Rx and reducing the in-band insertion losses of the filters 14A and 14C. Further, the bandpass characteristic of the filter 14C is the characteristic focusing on the out-of-band attenuation for widely securing the attenuation in Band 40 and Band 41 and reducing the in-band insertion losses of the filters 14A and 14B.

[5.8 Structure of Radio Frequency Circuit 3C]

Figure 18:
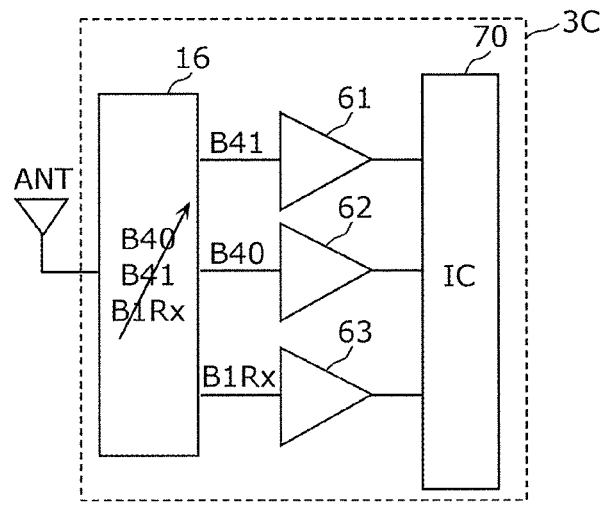
FIG. 18 is a structural diagram of a radio frequency circuit according to the second modified example of the fifth embodiment.

FIG. 18 is a structural diagram of a radio frequency circuit 3C according to the second modified example of the fifth embodiment. FIG. 18 illustrates the radio frequency circuit 3C configured to process the radio frequency signals in LTE Band 41, Band 40, and Band 1 Rx, and an LTE antenna element. The radio frequency circuit 3C and the LTE antenna element are arranged at the front end portion of one mobile terminal.

The radio frequency circuit 3C includes the multiplexer 16, reception amplification circuits 61, 62, and 63, and the RFIC 70.

In the structure described above, for example, (1) a CA operation of Band 41, Band 40, and Band 1 Rx, (2) a non-CA operation of Band 41, (3) a non-CA operation of Band 40, or (4) a non-CA operation of Band 1 Rx is selected. According to the radio frequency circuit 3C including the multiplexer 16 according to this modified example, the radio frequency signals in Band 41, Band 40, and Band 1 Rx pass through the filters 14A, 14B, and 14C without necessarily passing through the switches SW1A, SW1B, and SW1C when (1) is selected (CA mode). Therefore, the switch losses of the filters 14A, 14B, and 14C can be reduced. At this time, the resonant frequencies of the parallel arm circuits can be varied by the second parallel arm circuits and the attenuation and the attenuation band width of the filter 14A in Band 40 and Band 1 Rx, the attenuation and the attenuation band width of the filter 14B in Band 41 and Band 1 Rx, and the attenuation and the attenuation band width of the filter 14C in Band 41 and Band 40 can be adjusted with high accuracy. Therefore, the in-band insertion losses of the filters 14A, 14B, and 14C can be reduced. When one of (2) to (4) is selected (non-CA mode), the second series arm circuit is bypassed by conduction of the switch SW1A, SW1B, or SW1C. Therefore, the impedance of the parallel combination circuit of the second series arm circuit and the third series arm circuit is reduced. Thus, the radio frequency propagation loss in Band 41, Band 40, or Band 1 Rx can be reduced. Accordingly, the radio frequency propagation loss can be reduced while reducing the switch loss of the radio frequency circuit 3C according to this modified example.

Sixth Embodiment

A multiplexer according to this embodiment differs from the multiplexer according to the third embodiment in terms of specific circuit structures of the first series arm circuit, the second series arm circuit, the first parallel arm circuit, and the second parallel arm circuit. The structure of the multiplexer according to this embodiment is similar to the structure of the multiplexer 1 illustrated in FIG. 1 and therefore description is omitted hereinafter. The circuit structure and the bandpass characteristic of the first filter are mainly described.

[6.1 Circuit Structure of Filter 17 (First Filter)]

Figure 19A:
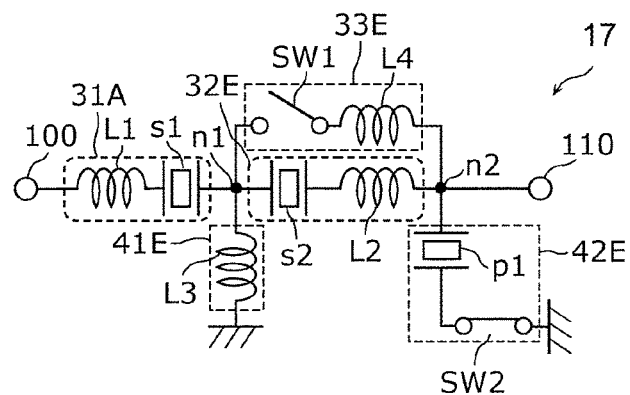
FIG. 19A is a circuit structure diagram illustrating the case in which the first switch is OFF and the second switch is ON in the first filter according to a sixth embodiment.
Figure 19B:
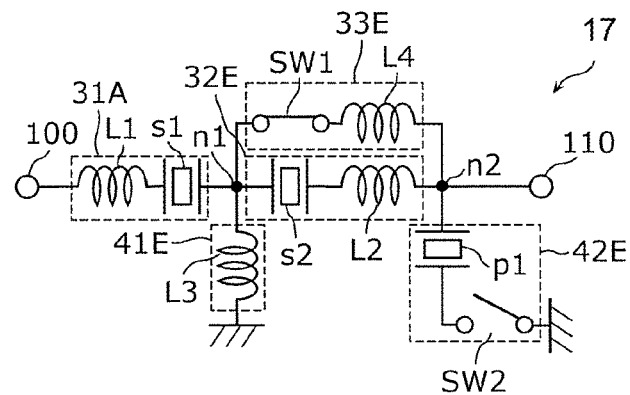
FIG. 19B is a circuit structure diagram illustrating the case in which the first switch is ON and the second switch is OFF in the first filter according to the sixth embodiment.

FIG. 19A is a circuit structure diagram illustrating a case in which the switch SW1 is OFF and the switch SW2 is ON in a filter 17 according to the sixth embodiment. FIG. 19B is a circuit structure diagram illustrating a case in which the switch SW1 is ON and the switch SW2 is OFF in the filter 17 according to the sixth embodiment.

As illustrated in FIG. 19A and FIG. 19B, the filter 17 includes series arm circuits 31A, 32E, and 33E and parallel arm circuits 41E and 42E. The filter 17 according to this embodiment differs from the filter 12 according to the third embodiment in terms of specific circuit structures of the series arm circuits and the parallel arm circuits. Description of the features of the filter 17 that are identical to those of the filter 12 is omitted and the different feature is mainly described below.

The series arm circuits 31A and 32E are the first series arm circuit and the second series arm circuit connected in series between the common terminal 100 and the input/output terminal 110. The series arm circuit 33E is the third series arm circuit connected in parallel to the series arm circuit 32E. The parallel arm circuit 41E is the first parallel arm circuit connected to the ground and to the node n1 on the first path connecting the common terminal 100 and the input/output terminal 110. The parallel arm circuit 42E is the second parallel arm circuit connected to the ground and to the node n2 on the first path connecting the common terminal 100 and the input/output terminal 110.

The series arm circuit 31A includes the series arm resonator s1 that is the acoustic wave resonator having the input terminal and the output terminal connected on the first path. The series arm circuit 31A further includes the inductor L1 connected in series to the series arm resonator s1 on the first path.

The series arm circuit 32E includes the series arm resonator s2 (first series arm resonator) that is the acoustic wave resonator having the input terminal and the output terminal connected on the first path. The series arm circuit 32E further includes the inductor L2 connected in series to the series arm resonator s2 on the first path.

The series arm circuit 33E includes the switch SW1 (first switch) having the input terminal and the output terminal connected on the second path connecting the two nodes n1 and n2 where the series arm circuit 32E and the series arm circuit 33E are connected in parallel. The series arm circuit 33E further includes an inductor L4 connected in series to the switch SW1 on the second path.

The parallel arm circuit 41E includes an inductor L3 connected between the node n1 and the ground.

The parallel arm circuit 42E includes the parallel arm resonator p1 that is the acoustic wave resonator connected between the node n2 and the ground, and the switch SW2 connected between the parallel arm resonator p1 and the ground.

In the circuit structure described above, when the filters 17 and 20 are operated simultaneously (CA mode), the controller brings the switch SW1 into the non-conductive state and the switch SW2 into the conductive state. When only the filter 17 out of the filters 17 and 20 is operated (non-CA mode), the controller brings the switch SW1 into the conductive state and the switch SW2 into the non-conductive state. That is, in the multiplexer according to this embodiment, when the radio frequency signals in the first frequency band and the second frequency band are passed simultaneously, the switch SW1 is in the non-conductive state and the switch SW2 is in the conductive state and, when only the radio frequency signal in the first frequency band out of the first frequency band and the second frequency band is passed, the switch SW1 is in the conductive state and the switch SW2 is in the non-conductive state.

According to the structure described above, when the radio frequency signals in the first frequency band and the second frequency band are passed simultaneously (CA mode), the radio frequency signal in the first frequency band passes through the filter 17 without necessarily passing through the switch SW1. Therefore, a switch loss of the filter 17 can be reduced. At this time, the resonant frequencies and the anti-resonant frequencies of the series arm circuits and the parallel arm circuit can be adjusted by the inductors of the series arm circuits 31A, 32E, and 33E and the parallel arm circuit 41E and the band width of the filter 17 and attenuation of the filter 17 in the second frequency band can be adjusted with high accuracy. Thus, the in-band insertion loss of the filter 20 can be reduced.

Further, the parallel arm circuit 42E is caused to function by conduction of the switch SW2. Therefore, an attenuation characteristic in the vicinity of the pass band can be enhanced without necessarily causing the radio frequency propagation loss in the main path (first path) due to the conduction of the switch SW2.

When only the radio frequency signal in the first frequency band out of the first frequency band and the second frequency band is passed, the series arm circuit 32E is bypassed by conduction of the switch SW1. Therefore, the impedance of a parallel combination circuit of the series arm circuits 32E and 33E is reduced. Thus, the radio frequency propagation loss in the main path of the filter 17 can be reduced. Accordingly, the radio frequency propagation loss can be reduced while reducing the switch loss of the multiplexer according to this embodiment. Further, a combined admittance of the parallel arm circuit 42E in the first frequency band is reduced by bringing the switch SW2 into non-conduction. Therefore, an insertion loss in the pass band of the filter 17 can be reduced without necessarily causing the radio frequency propagation loss in the main path (first path) due to the non-conduction of the switch SW2. Further, the resonant frequencies and the anti-resonant frequencies of the series arm circuits and the parallel arm circuit can be adjusted by the inductors of the series arm circuits 31A, 32E, and 33E and the parallel arm circuit 41E and the band width and the attenuation of the filter 17 can be adjusted with high accuracy. Thus, the radio frequency propagation loss can be reduced while reducing the switch loss of the multiplexer.

[6.2 Bandpass Characteristics of Multiplexer]

The bandpass characteristic of the filter 17 that constitutes the multiplexer is described. The circuit structure of the filter 20 is optional and therefore description of the bandpass characteristic of the filter 20 is omitted. Further, this embodiment shows an example in which the filter 17 is applied to, for example, MB (Middle Band: 1710 to 2200 MHz) and the filter 20 is applied to, for example, HB1 (High Band 1: 2300 to 2400 MHz) or HB2 (High Band 2: 2500 to 2690 MHz). That is, the first frequency band that is the pass band of the filter 17 is lower than the second frequency band that is the pass band of the filter 20.

Figure 20A:
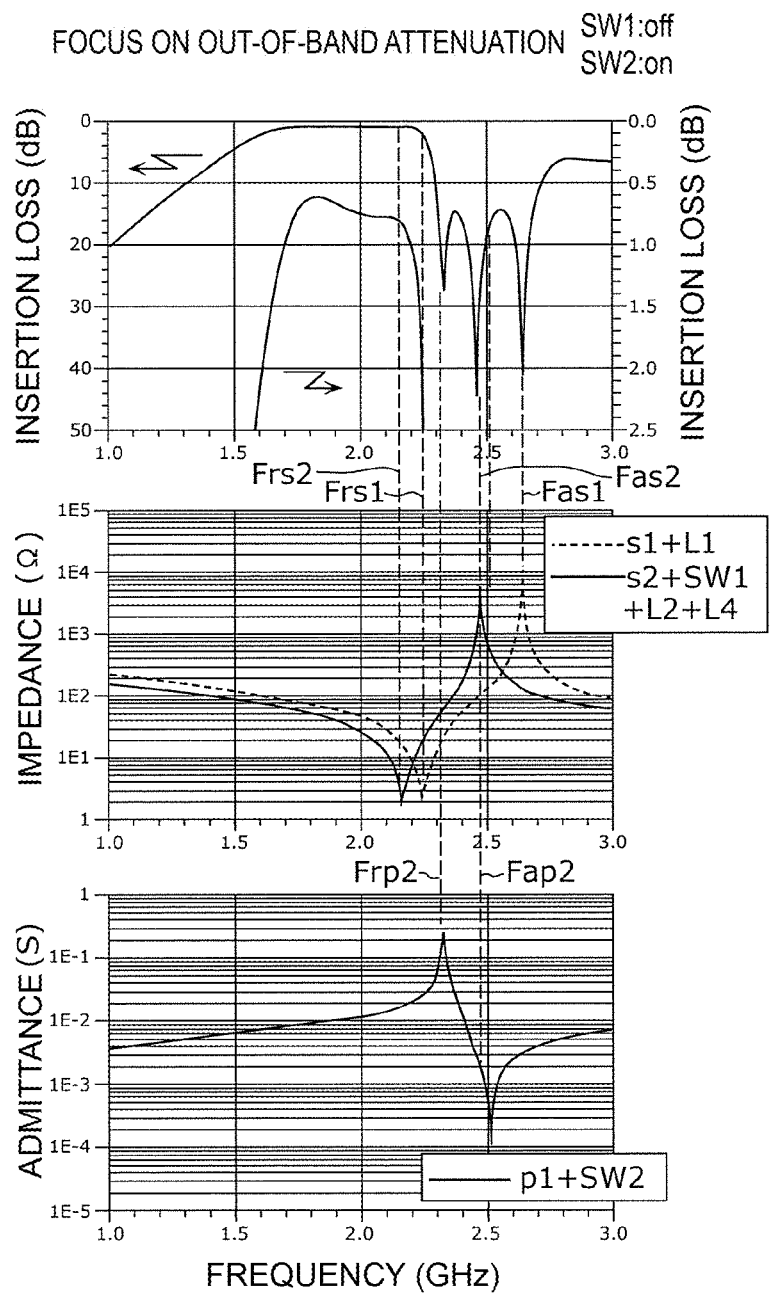
FIG. 20A is a graph illustrating a bandpass characteristic, an impedance characteristic, and an admittance characteristic in the case in which the first switch is OFF and the second switch is ON in the first filter according to the sixth embodiment.
Figure 20B:
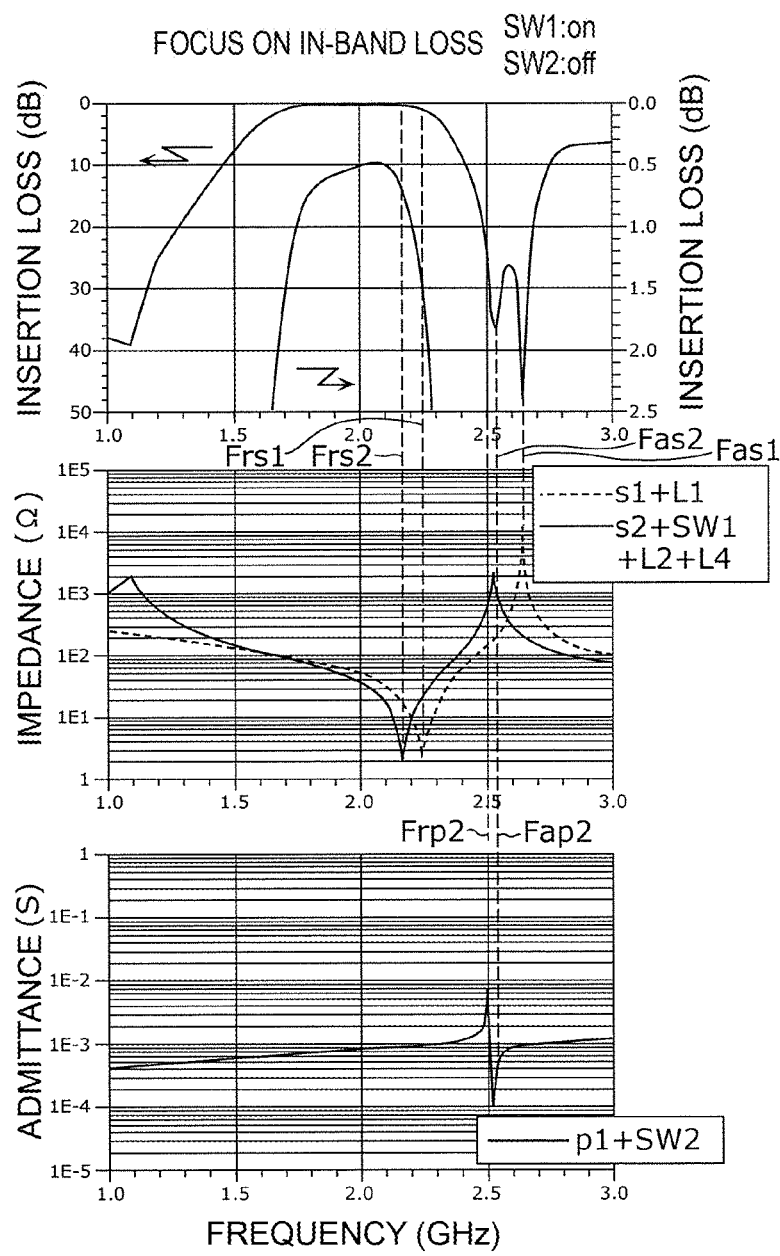
FIG. 20B is a graph illustrating a bandpass characteristic, an impedance characteristic, and an admittance characteristic in the case in which the first switch is ON and the second switch is OFF in the first filter according to the sixth embodiment.

FIG. 20A is a graph illustrating a bandpass characteristic, an impedance characteristic, and an admittance characteristic in the case in which the switch SW1 is OFF and the switch SW2 is ON in the filter 17 according to the sixth embodiment. FIG. 20B is a graph illustrating a bandpass characteristic, an impedance characteristic, and an admittance characteristic in the case in which the switch SW1 is ON and the switch SW2 is OFF in the filter 17 according to the sixth embodiment. More specifically, FIG. 20A and FIG. 20B illustrate, in their upper stages, bandpass characteristics of the filter 17 in the case in which the switch SW1 is OFF and the switch SW2 is ON and in the case in which the switch SW1 is ON and the switch SW2 is OFF, respectively. FIG. 20A and FIG. 20B illustrate, in their middle stages, impedance characteristics of the series arm circuits in the case in which the switch SW1 is OFF and the switch SW2 is ON and in the case in which the switch SW1 is ON and the switch SW2 is OFF, respectively. FIG. 20A and FIG. 20B illustrate, in their lower stages, admittance characteristics of the parallel arm circuits in the case in which the switch SW1 is OFF and the switch SW2 is ON and in the case in which the switch SW1 is ON and the switch SW2 is OFF, respectively.

As illustrated in FIG. 19A and FIG. 19B, the filter 17 constitutes a low pass filter circuit including the series arm circuits 31A, 32E, and 33E and the parallel arm circuits 41E and 42E.

When the switch SW1 of the series arm circuit 33E is OFF (FIG. 19A), the anti-resonant frequency Fas2 of the parallel combination circuit of the series arm circuits 32E and 33E (series arm resonator s2+switch SW1+inductor L2+inductor L4) is located in the vicinity of the pass band of the filter 20 (second frequency band) as illustrated in the upper stage and the middle stage of FIG. 20A. Further, an anti-resonant frequency Fas1 of the series arm circuit 31A (series arm resonator s1+inductor L1) is located in the vicinity of the pass band of the filter 20 (second frequency band) and is higher than the anti-resonant frequency Fas2.

Thus, when the radio frequency signals in the first frequency band and the second frequency band are passed simultaneously (CA mode), the attenuation of the filter 17 in the second frequency band can be secured greatly. Accordingly, the in-band insertion loss of the filter 20 can be reduced.

Further, the switch SW2 of the parallel arm circuit 42E is ON (FIG. 19A) and therefore the resonant frequency Frp2 and the anti-resonant frequency Fap2 of the parallel arm circuit 42E (parallel arm resonator p1+switch SW2) are higher than the higher frequency end of the first frequency band and are located within the second frequency band as illustrated in the upper stage and the lower stage of FIG. 20A.

Thus, when the radio frequency signals in the first frequency band and the second frequency band are passed simultaneously (CA mode), the attenuation of the filter 17 in the second frequency band can be secured greatly. Accordingly, the in-band insertion loss of the filter 20 can be reduced.

When the switch SW1 of the series arm circuit 33E is ON (FIG. 19B), the series arm circuit 32E is bypassed. When only the radio frequency signal in the first frequency band out of the first frequency band and the second frequency band is passed (non-CA mode), it is appropriate that the bandpass characteristic of the filter 17 be improved without necessarily consideration of the bandpass characteristic of the filter 20.

Further, the switch SW2 of the parallel arm circuit 42E is OFF (FIG. 19B) and therefore the resonant frequency Frp2 of the parallel arm circuit 42E (parallel arm resonator p1+switch SW2) is shifted to a higher frequency side compared with the case in which the switch SW2 is ON as illustrated in the upper stage and the lower stage of FIG. 20B.

Accordingly, when only the radio frequency signal in the first frequency band out of the first frequency band and the second frequency band is passed (non-CA mode), the resonant frequency Frp2 of the parallel arm circuit 42E is shifted to the higher frequency side and therefore improvement can be observed in terms of the insertion loss at the higher frequency end of the first frequency band. Thus, the radio frequency propagation loss of the filter 17 can further be reduced.

Figure 20C:
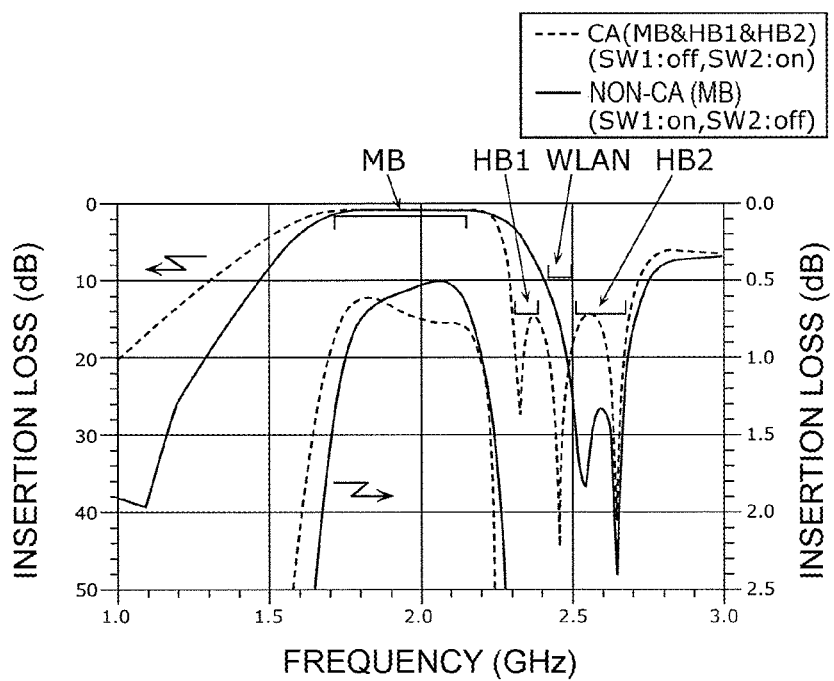
FIG. 20C is a graph illustrating comparison of the bandpass characteristics between the CA mode and the non-CA mode in the first filter according to the sixth embodiment.

FIG. 20C is a graph illustrating comparison of the bandpass characteristics between the CA mode and the non-CA mode in the filter 17 according to the sixth embodiment.

As described above, when the switch SW1 is ON and the switch SW2 is OFF, only the radio frequency signal in the first frequency band (MB) out of the first frequency band (MB) and the second frequency band (HB1 or HB2) is passed. Therefore, the bandpass characteristic of the filter 17 is the characteristic focusing on the in-band insertion loss for improving the bandpass characteristic of the filter 17 without necessarily consideration of the bandpass characteristic of the filter 20.

When the switch SW1 is OFF and the switch SW2 is ON, the radio frequency signals in the first frequency band (MB) and the second frequency band (HB1 or HB2) are passed simultaneously. Therefore, the bandpass characteristic of the filter 17 is the characteristic focusing on the out-of-band attenuation for widely securing the attenuation in the second frequency band (HB1 or HB2) and reducing the in-band insertion loss of the filter 20.

[6.3 Structure of Radio Frequency Circuit 3D]

Figure 21A:
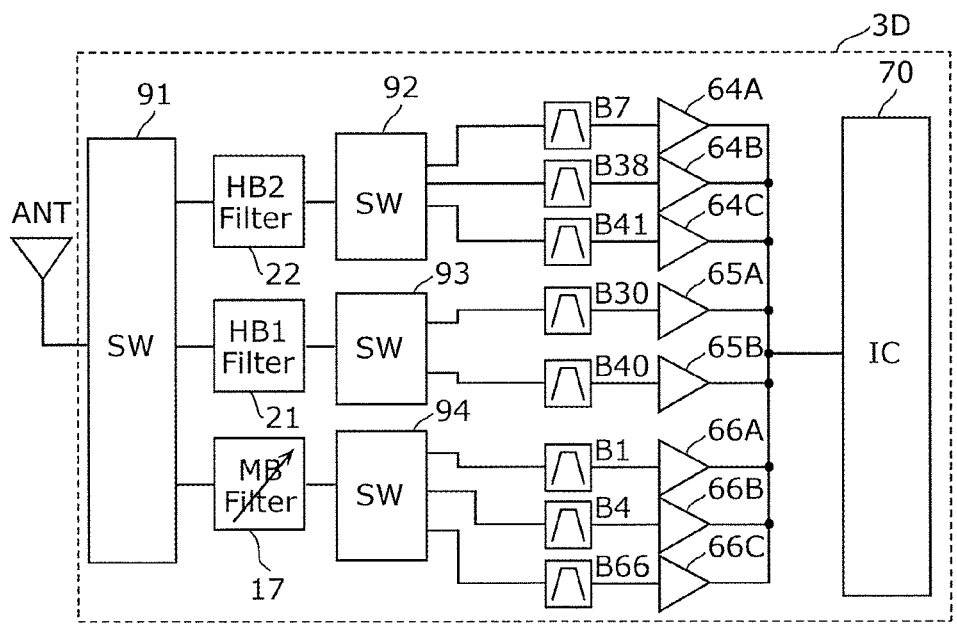
FIG. 21A is a structural diagram of a radio frequency circuit according to the sixth embodiment.
Figure 21B:
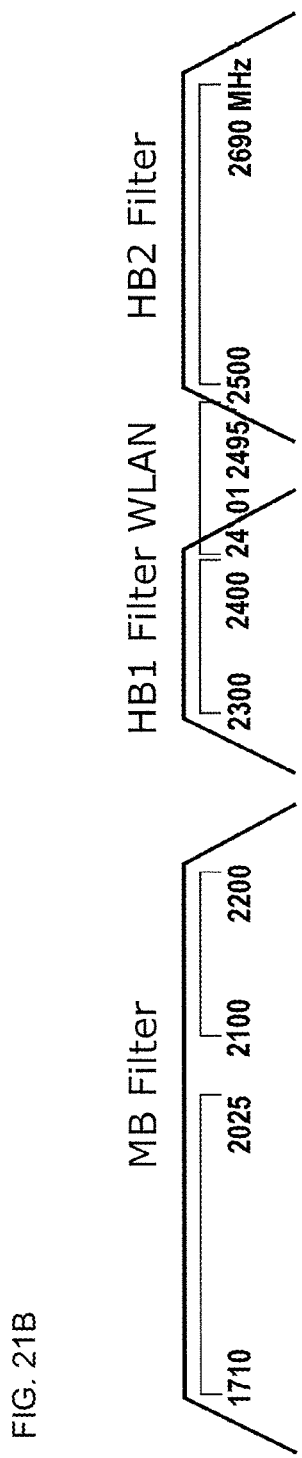
FIG. 21B is a diagram illustrating an example of band application of the radio frequency circuit according to the sixth embodiment.

FIG. 21A is a structural diagram of a radio frequency circuit 3D including the filter 17 and its peripheral circuit according to the sixth embodiment. FIG. 21B is a diagram illustrating an example of band application of the radio frequency circuit 3D according to the sixth embodiment. FIG. 21A illustrates the radio frequency circuit 3D configured to process radio frequency signals of LTE, and an LTE antenna element. For example, the radio frequency circuit 3D and the LTE antenna element are arranged at the front end portion of one mobile terminal.

The radio frequency circuit 3D includes filters 17, 21, and 22, switches 91, 92, 93, and 94, a B7 filter, a B38 filter, a B41 filter, a B30 filter, a B40 filter, a B1 filter, a B4 filter, a B66 filter, reception amplification circuits 64A, 64B, 64C, 65A, 65B, 66A, 66B, and 66C, and the RFIC 70.

The switch 91 is a switch circuit configured to switch connection between each of the filters 17, 21, and 22 and the LTE antenna element and can select one or more filters out of the filters 17, 21, and 22.

The filter 17 is the filter 17 according to this embodiment and is a filter whose pass band is MB (1710 to 2200 MHz).

The filter 21 is a filter whose pass band is HB1 (High Band 1: 2300 to 2400 MHz).

The filter 22 is a filter whose pass band is HB2 (High Band 2: 2500 to 2690 MHz).

The switch 92 is a switch configured to switch connection between the filter 22 and each of the B7 filter, the B38 filter, and the B41 filter and is, for example, an SP3T (single pole/three throw) switch.

The switch 93 is a switch configured to switch connection between the filter 21 and each of the B30 filter and the B40 filter and is, for example, an SPDT (single pole/double throw) switch.

The switch 94 is a switch configured to switch connection between the filter 17 and each of the B1 filter, the B4 filter, and the B66 filter and is, for example, an SP3T (single pole/three throw) switch.

Each of the reception amplification circuits 64A to 66C amplifies a reception signal from a filter connected to an input terminal and outputs the reception signal to the RFIC 70.

In the structure described above, for example, (1) a CA operation of one band in MB, one band in HB1, and one band in HB2, (2) a CA operation of one band in MB and one band in HB1, (3) a CA operation of one band in MB and one band in HB2, (4) a CA operation of one band in HB1 and one band in HB2, (5) a non-CA operation of one band in MB, (6) a non-CA operation of one band in HB1, or (7) a non-CA operation of one band in HB2 is selected. Even if the selection is made from among (1) to (7), by applying the multiplexer including the filter 17 according to this embodiment, a radio frequency signal in MB passes through the filter 17 without necessarily passing through the switch SW1 when one of (1) to (3) is selected (CA mode). Therefore, the switch loss of the filter 17 can be reduced. When (5) is selected (non-CA mode), the series arm circuit 32E is bypassed by conduction of the switch SW1. Therefore, the impedance of the parallel combination circuit of the series arm circuits 32E and 33E is reduced. Thus, a radio frequency propagation loss in MB can be reduced. Accordingly, the radio frequency propagation loss can be reduced while reducing the switch loss of the radio frequency circuit 3D according to this embodiment. Attenuation in the WLAN band can be achieved even in the non-CA mode if the system uses WLAN in combination as illustrated in FIG. 21B. Thus, it is possible to reduce the occurrence of a case in which reception sensitivity decreases due to interference between the radio frequency signal in MB and a radio frequency signal in the WLAN band.

The switch 91 may be omitted depending on the selection structure for MB, HB1, and HB2.

[6.4 Structure of Multiplexer 19]

Figure 22:
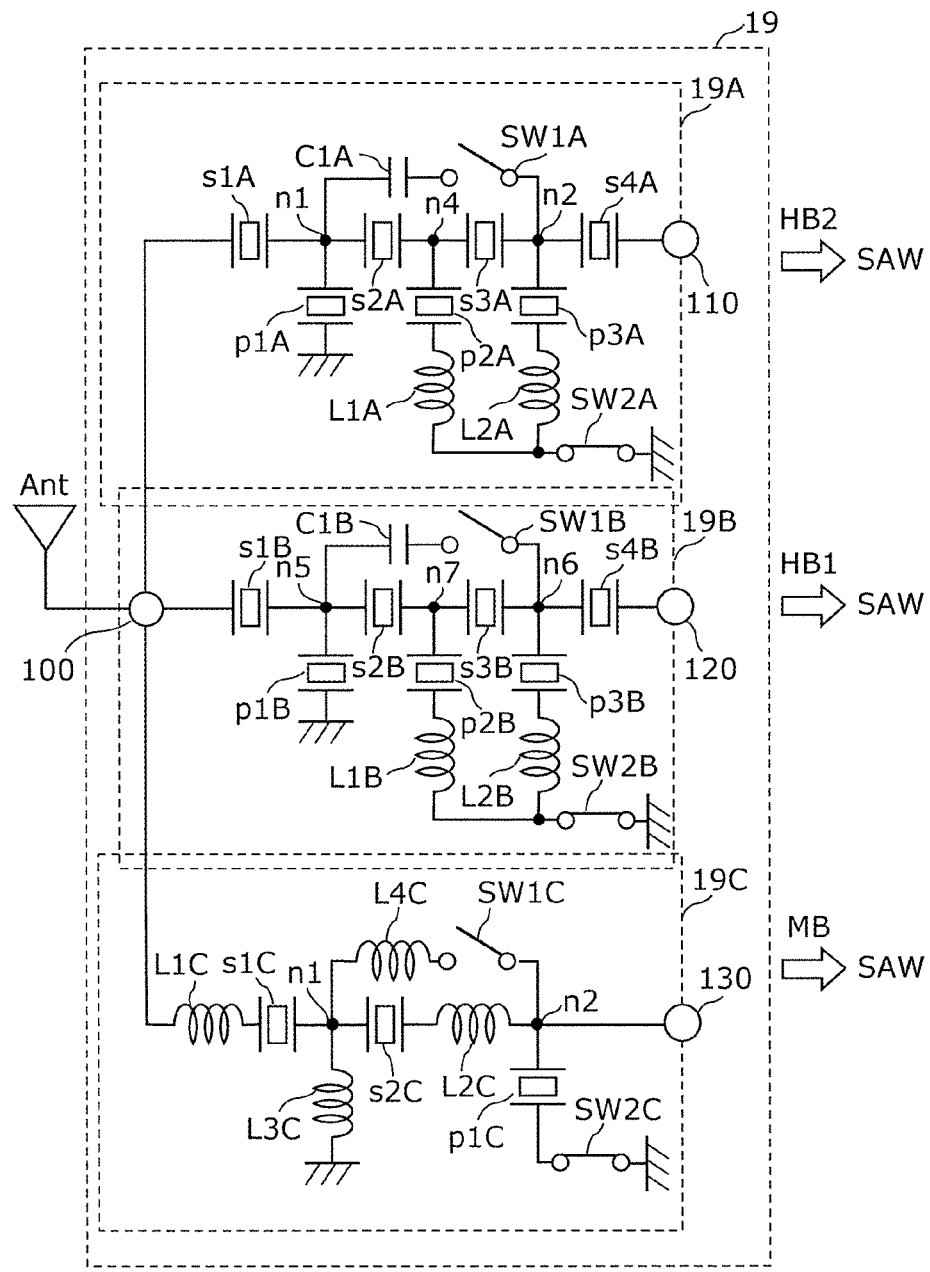
FIG. 22 is a circuit structure diagram of a multiplexer according to a modified example of the sixth embodiment.

FIG. 22 is a circuit structure diagram of a multiplexer 19 according to a modified example of the sixth embodiment. The multiplexer 19 according to this modified example differs from the multiplexer according to the sixth embodiment in terms of a structure in which three filters that constitute the multiplexer all include switches. The multiplexer 19 includes the common terminal 100, the input/output terminals 110, 120, and 130, a filter 19A, a filter 19B, and a filter 19C.

This modified example is an example in which the filter 19A is applied to, for example, HB2, the filter 19B is applied to, for example, HB1, and the filter 19C is applied to, for example, MB.

The filter 19A is an acoustic wave filter whose pass band is HB2 and has the same circuit structure as the filter 14A that constitutes the multiplexer 16.

The filter 19B is an acoustic wave filter whose pass band is HB1 and has the same circuit structure as the filter 14B that constitutes the multiplexer 16.

The filter 19C is an acoustic wave filter whose pass band is MB and has the same circuit structure as the filter 17 that constitutes the multiplexer according to this embodiment.

In the circuit structure described above, when the filters 19A, 19B, and 19C are operated simultaneously (CA mode), the controller brings the switches SW1A, SW1B, and SW1C into the non-conductive state and the switches SW2A, SW2B, and SW2C into the conductive state. When only the filter 19A out of the filters 19A, 19B, and 19C is operated (non-CA mode), the controller brings the switch SW1A into the conductive state and the switch SW2A into the non-conductive state, brings the switch SW1B into the non-conductive state and the switch SW2B into the conductive state, and brings the switch SW1C into the non-conductive state and the switch SW2C into the conductive state. When only the filter 19B out of the filters 19A, 19B, and 19C is operated (non-CA mode), the controller brings the switch SW1B into the conductive state and the switch SW2B into the non-conductive state, brings the switch SW1A into the non-conductive state and the switch SW2A into the conductive state, and brings the switch SW1C into the non-conductive state and the switch SW2C into the conductive state. When only the filter 19C out of the filters 19A, 19B, and 19C is operated (non-CA mode), the controller brings the switch SW1C into the conductive state and the switch SW2C into the non-conductive state, brings the switch SW1A into the non-conductive state and the switch SW2A into the conductive state, and brings the switch SW1B into the non-conductive state and the switch SW2B into the conductive state.

That is, in the multiplexer 19 according to this modified example, when the radio frequency signals in HB2, HB1, and MB are passed simultaneously, the switches SW1A, SW1B, and SW1C are in the non-conductive state and the switches SW2A, SW2B, and SW2C are in the conductive state. When only the radio frequency signal in HB2 out of HB2, HB1, and MB is passed, the switch SW1A is in the conductive state, the switch SW2A is in the non-conductive state, the switch SW1B is in the non-conductive state, the switch SW2B is in the conductive state, the switch SW1C is in the non-conductive state, and the switch SW2C is in the conductive state. When only the radio frequency signal in HB1 out of HB2, HB1, and MB is passed, the switch SW1B is in the conductive state, the switch SW2B is in the non-conductive state, the switch SW1A is in the non-conductive state, the switch SW2A is in the conductive state, the switch SW1C is in the non-conductive state, and the switch SW2C is in the conductive state. When only the radio frequency signal in MB out of HB2, HB1, and MB is passed, the switch SW1C is in the conductive state, the switch SW2C is in the non-conductive state, the switch SW1A is in the non-conductive state, the switch SW2A is in the conductive state, the switch SW1B is in the non-conductive state, and the switch SW2B is in the conductive state.

According to the structure described above, when the radio frequency signals in HB2, HB1, and MB are passed simultaneously (CA mode), the radio frequency signals in HB2, HB1, and MB pass through the filters 19A, 19B, and 19C without necessarily passing through the switches SW1A, SW1B, and SW1C. Therefore, switch losses of the filters 19A, 19B, and 19C can be reduced. At this time, the resonant frequencies and the anti-resonant frequencies of the second series arm circuits can be adjusted by the series arm resonators s2A, s2B, s3A, and s3B of the second series arm circuits and attenuation of the filter 19A in HB1 and MB and attenuation of the filter 19B in HB2 and MB can be adjusted with high accuracy. Therefore, in-band insertion losses of the filters 19A, 19B, and 19C can be reduced mutually.

Further, the second parallel arm circuits are caused to function by conduction of the switches SW2A, SW2B, and SW2C. Therefore, attenuation characteristics in the vicinity of the pass bands can be enhanced without necessarily causing radio frequency propagation losses in main paths (first paths) due to the conduction of the switches SW2A, SW2B, and SW2C. At this time, the resonant frequencies of the second parallel arm circuits can be adjusted by the inductors L1A, L1B, L2A, and L2B and the attenuation of the filter 19A in HB1 and MB and the attenuation of the filter 19B in HB2 and MB can be adjusted with high accuracy. Therefore, the in-band insertion losses of the filters 19A, 19B, and 19C can be reduced mutually.

When only the radio frequency signal in HB2 out of HB2, HB1, and MB is passed, the second series arm circuit is bypassed by conduction of the switch SW1A. Therefore, the impedance of a parallel combination circuit of the second series arm circuit and the third series arm circuit is reduced. Thus, the radio frequency propagation loss in the main path of the filter 19A can be reduced. At this time, impedance mismatching in the main path due to the bypassing can be avoided by arranging the capacitor CIA. When only the radio frequency signal in HB1 out of HB2, HB1, and MB is passed, the second series arm circuit is bypassed by conduction of the switch SW1B. Therefore, the impedance of a parallel combination circuit of the second series arm circuit and the third series arm circuit is reduced. Thus, the radio frequency propagation loss in the main path of the filter 19B can be reduced. At this time, impedance mismatching in the main path due to the bypassing can be avoided by arranging the capacitor C1B. When only the radio frequency signal in MB out of HB2, HB1, and MB is passed, the second series arm circuit is bypassed by conduction of the switch SW1C. Therefore, the impedance of a parallel combination circuit of the second series arm circuit and the third series arm circuit is reduced. Thus, the radio frequency propagation loss in the main path of the filter 19C can be reduced.

Accordingly, the radio frequency propagation loss can be reduced while reducing the switch loss of the multiplexer 19 according to this modified example. Further, a combined admittance in HB2 is reduced by bringing the switch SW2A into non-conduction, a combined admittance in HB1 is reduced by bringing the switch SW2B into non-conduction, and a combined admittance in MB is reduced by bringing the switch SW2C into non-conduction. Therefore, insertion losses in the pass bands of the filters 19A, 19B, and 19C can be reduced without necessarily causing radio frequency propagation losses in the main paths (first paths) due to the non-conduction of the switches SW2A, SW2B, and SW2C. Thus, the radio frequency propagation loss can be reduced while reducing the switch loss of the multiplexer 19.

[6.5 Bandpass Characteristics of Multiplexer 19]

Figure 23:
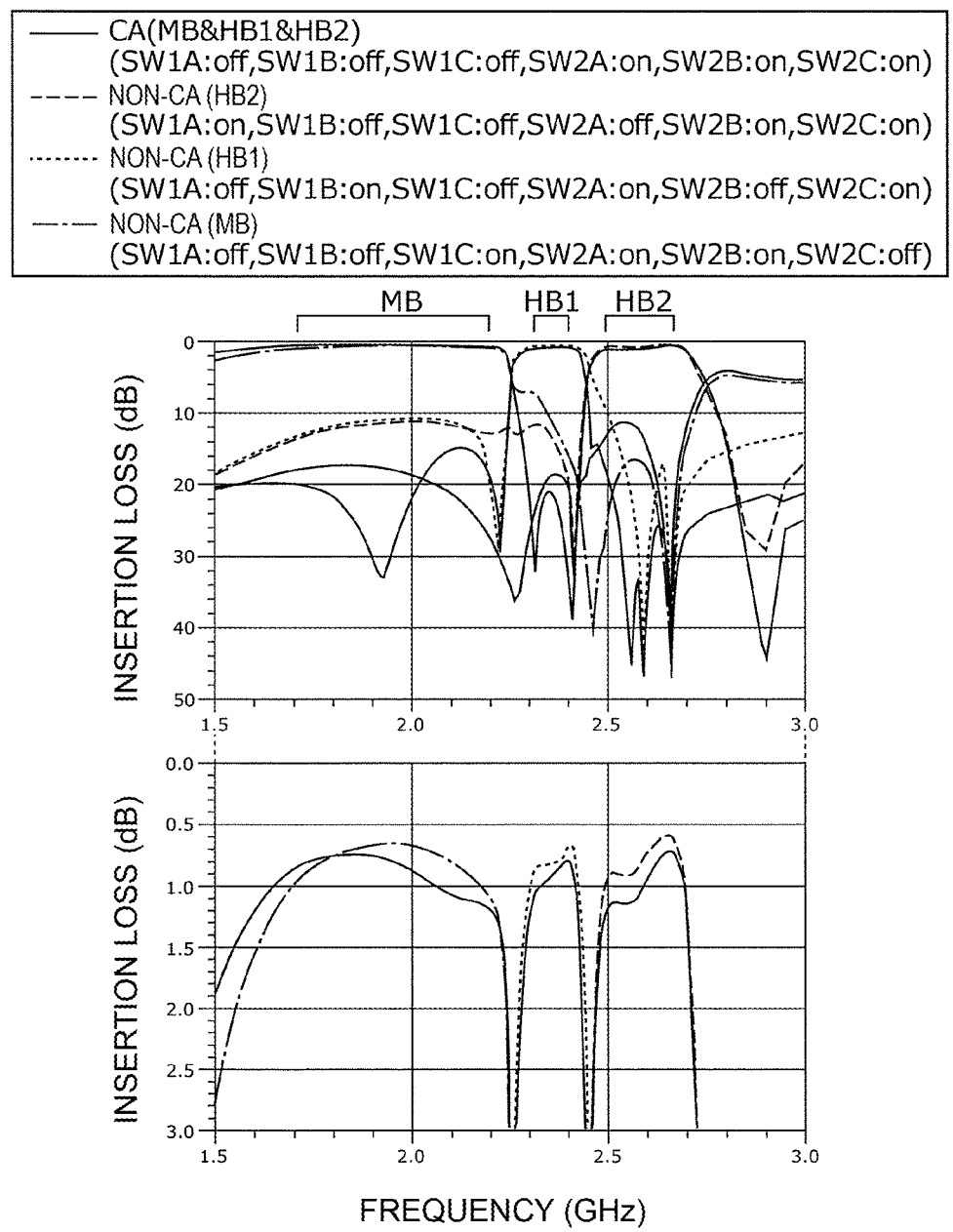
FIG. 23 is a graph illustrating bandpass characteristics in the CA mode and the non-CA mode in the multiplexer according to the modified example of the sixth embodiment.

FIG. 23 is a graph illustrating bandpass characteristics in the CA mode and the non-CA mode in the multiplexer 19 according to the modified example of the sixth embodiment.

As described above, when only HB2 is selected (non-CA (HB2)), the bandpass characteristic of the filter 19A is the characteristic focusing on the in-band insertion loss for improving the bandpass characteristic of the filter 19A without necessarily consideration of the bandpass characteristics of the filters 19B and 19C. When only HB1 is selected (non-CA (HB1)), the bandpass characteristic of the filter 19B is the characteristic focusing on the in-band insertion loss for improving the bandpass characteristic of the filter 19B without necessarily consideration of the bandpass characteristics of the filters 19A and 19C. When only MB is selected (non-CA (MB)), the bandpass characteristic of the filter 19C is the characteristic focusing on the in-band insertion loss for improving the bandpass characteristic of the filter 19C without necessarily consideration of the bandpass characteristics of the filters 19A and 19B.

When HB2, HB1, and MB are selected simultaneously (CA (MB & HB1 & HB2)), the bandpass characteristic of the filter 19A is the characteristic focusing on the out-of-band attenuation for widely securing the attenuation in HB1 and MB and reducing the in-band insertion losses of the filters 19B and 19C. Further, the bandpass characteristic of the filter 19B is the characteristic focusing on the out-of-band attenuation for widely securing the attenuation in HB2 and MB and reducing the in-band insertion losses of the filters 19A and 19C. Further, the bandpass characteristic of the filter 19C is the characteristic focusing on the out-of-band attenuation for widely securing the attenuation in HB2 and HB1 and reducing the in-band insertion losses of the filters 19A and 19B.

[6.6 Structure of Radio Frequency Circuit 3E]

Figure 24:
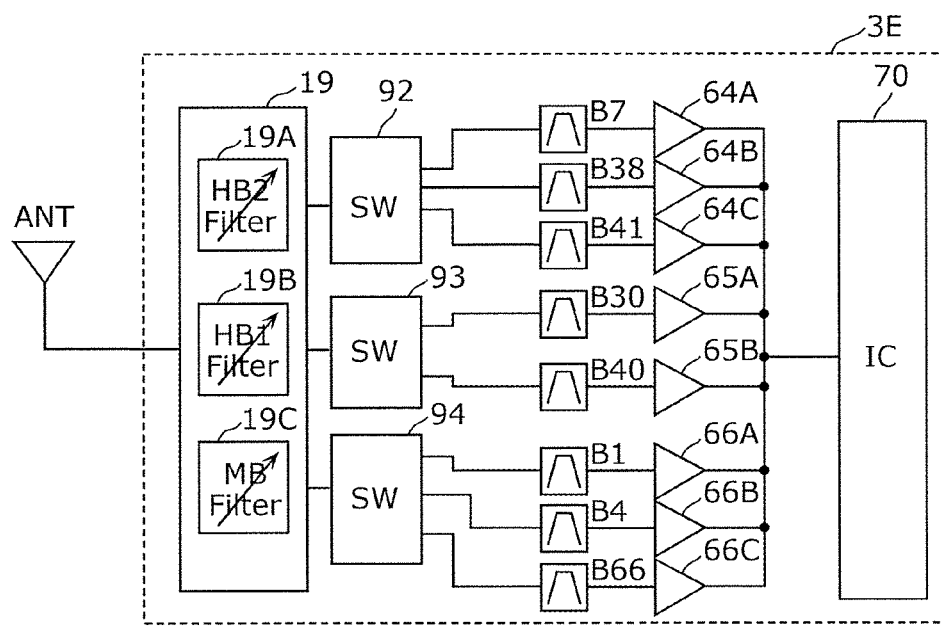
FIG. 24 is a structural diagram of a radio frequency circuit according to the modified example of the sixth embodiment.

FIG. 24 is a structural diagram of a radio frequency circuit 3E including the multiplexer 19 and its peripheral circuit according to the modified example of the sixth embodiment. FIG. 24 illustrates the radio frequency circuit 3E configured to process radio frequency signals of LTE, and an LTE antenna element. For example, the radio frequency circuit 3E and the LTE antenna element are arranged at the front end portion of one mobile terminal.

The radio frequency circuit 3E includes the multiplexer 19, the switches 92, 93, and 94, the B7 filter, the B38 filter, the B41 filter, the B30 filter, the B40 filter, the B1 filter, the B4 filter, the B66 filter, the reception amplification circuits 64A, 64B, 64C, 65A, 65B, 66A, 66B, and 66C, and the RFIC 70. The radio frequency circuit 3E according to this modified example differs from the radio frequency circuit 3D according to the sixth embodiment in that the switch 91 is not arranged and the HB2 filter, the HB1 filter, and the MB filter include switches. Description of the features of the radio frequency circuit 3E according to this modified example that are identical to those of the radio frequency circuit 3D is omitted and the different features are mainly described below.

The multiplexer 19 is the multiplexer 19 according to this modified example and has a structure in which the filter 19A whose pass band is HB2, the filter 19B whose pass band is HB1, and the filter 19C whose pass band is MB are connected to the common terminal 100.

The switch 92 is a switch configured to switch connection between the filter 19A and each of the B7 filter, the B38 filter, and the B41 filter and is, for example, an SP3T switch.

The switch 93 is a switch configured to switch connection between the filter 19B and each of the B30 filter and the B40 filter and is, for example, an SPDT switch.

The switch 94 is a switch configured to switch connection between the filter 19C and each of the B1 filter, the B4 filter, and the B66 filter and is, for example, an SP3T switch.

In the structure described above, for example, (1) a CA operation of one band in MB, one band in HB1, and one band in HB2, (2) a CA operation of one band in MB and one band in HB1, (3) a CA operation of one band in MB and one band in HB2, (4) a CA operation of one band in HB1 and one band in HB2, (5) a non-CA operation of one band in MB, (6) a non-CA operation of one band in HB1, or (7) a non-CA operation of one band in HB2 is selected. Even if the selection is made from among (1) to (7), by applying the multiplexer 19 according to this modified example, the radio frequency signals in MB, HB1, and HB2 pass through the filters 19A, 19B, and 19C without necessarily passing through the switches SW1 when one of (1) to (4) is selected (CA mode). Therefore, the switch loss of the multiplexer 19 can be reduced.

When one of (5) to (7) is selected (non-CA mode), the second series arm circuit is bypassed by conduction of the switch SW1. Therefore, the impedance of the parallel combination circuit of the second series arm circuit and the third series arm circuit is reduced. Thus, the radio frequency propagation loss in MB, HB1, or HB2 can be reduced. Accordingly, the radio frequency propagation loss can be reduced while reducing the switch loss of the radio frequency circuit 3E according to this embodiment.

The radio frequency circuit 3E including the multiplexer 19 according to this modified example can support a system in which the complicated CA and non-CA modes of LTE are mixed together.

Other Embodiments

The multiplexers, the radio frequency circuits, and the communication devices according to the embodiments of the present disclosure have been described above taking the first to sixth embodiments and the modified examples. The multiplexer, the radio frequency circuit, and the communication device of the present disclosure are not limited to those in the embodiments and the modified examples described above. The present disclosure encompasses other embodiments implemented by combining optional constituent elements of the embodiments and the modified examples described above, modified examples attained by various modifications conceivable by persons skilled in the art to the embodiments and the modified examples described above without necessarily departing from the spirit of the present disclosure, and various apparatuses including the multiplexer, the radio frequency circuit, and the communication device disclosed herein.

Description is made of the example in which the multiplexer according to each of the embodiments and the modified examples described above is constituted by the plurality of reception filters. The multiplexer according to the present disclosure may be constituted by a plurality of transmission filters or by both transmission filters and reception filters.

In the radio frequency filters according to the first to fifth embodiments, each of the series arm resonators and the parallel arm resonators is not limited to a single acoustic wave resonator but may be a plurality of split resonators obtained by, for example, splitting a single acoustic wave resonator in series.

In the multiplexers, the radio frequency circuits, and the communication devices according to the first to sixth embodiments and the modified examples, an inductance element or a capacitance element may further be connected between each input/output terminal and the common terminal. Further, an inductance component may be provided by wiring that connects the respective circuit elements.

INDUSTRIAL APPLICABILITY

The present disclosure can widely be used for communication apparatuses such as a mobile phone as the multiplexer, the radio frequency circuit, and the communication device applicable to the multi-band/multi-mode system that uses a plurality of bands simultaneously or exclusively.

REFERENCE SIGNS LIST 1, 15, 16, 19 multiplexer
2 antenna element
3, 3A, 3B, 3C, 3D, 3E radio frequency circuit
4 communication device
10, 11, 12, 13, 14, 14A, 14B, 14C, 17, 19A, 19B, 19C, 20, 21, 22, 50 filter
31, 31A, 31C, 31D, 32, 32A, 32C, 32D, 32E, 33, 33C, 33D, 33E, 34, 34C, 34D series arm circuit
41, 41A, 41B, 41C, 41D, 41E, 42, 42A, 42B, 42C, 42D, 42E parallel arm circuit
61, 62, 63, 64A, 64B, 64C, 65A, 65B, 66A, 66B, 66C reception amplification circuit
70, 71 RF signal processing circuit (RFIC)
80 baseband signal processing circuit (BBIC)
90, 91, 92, 93, 94, SW1, SW1A, SW1B, SW1C, SW2, SW2A, SW2B, SW2C switch
100 common terminal
110, 120 input/output terminal
C1A, C1B, C1C capacitor
L1, L1A, L1B, L2, L2A, L2B, L1C, L2C, L3, L3C, L4, L4C inductor
p1, p1A, p1B, p1C, p2, p2A, p2B, p2C, p3, p3A, p3B, p3C parallel arm resonator
s1, s1A, s1B, s1C, s2, s2A, s2B, s2C, s3, s3A, s3B, s4, s4A, s4B series arm resonator

The invention claimed is:

1. A multiplexer, comprising:
a common terminal, a first input/output terminal, and a second input/output terminal;
a first filter arranged between the common terminal and the first input/output terminal and configured to pass a radio frequency signal in a first frequency band; and
a second filter arranged between the common terminal and the second input/output terminal and configured to pass a radio frequency signal in a second frequency band allocated,
wherein the first filter comprises:
a first series arm circuit and a second series arm circuit connected in series between the common terminal and the first input/output terminal;
a third series arm circuit connected in parallel with the second series arm circuit; and
a first parallel arm circuit connected between ground and a first node on a first path, the first path connecting the common terminal and the first input/output terminal,
wherein the second series arm circuit comprises a first series arm resonator in the first path, the first series arm resonator being an acoustic wave resonator,
wherein the third series arm circuit comprises a first switch in a second path,
wherein, when the radio frequency signal in the first frequency band and the second frequency band are passed simultaneously, the first switch is in a non-conductive state, and
wherein, when the radio frequency signal in the first frequency band is passed and the radio frequency signal in the second frequency band is not passed, the first switch is in a conductive state.

2. The multiplexer according to claim 1, wherein when the first switch is in the non-conductive state, an anti-resonant frequency of the second and third series arm circuits is within the second frequency band.

3. The multiplexer according to claim 1, wherein a resonant frequency of the second and third series arm circuits is greater than a resonant frequency of the first series arm circuit and is greater than the first frequency band.

4. The multiplexer according to claim 1, wherein the third series arm circuit further comprises an impedance element in the second path and connected in series to the first switch.

5. The multiplexer according to claim 1,
wherein the first filter further comprises a second parallel arm circuit connected between ground and a second node on the first path,
wherein the second parallel arm circuit comprises:
a first parallel arm resonator connected between the second node and ground, the first parallel arm resonator being an acoustic wave resonator; and
a second switch connected between the first parallel arm resonator and ground,
wherein, when the radio frequency signal in the first frequency band and the second frequency band are passed simultaneously, the second switch is in a conductive state, and
wherein, when the radio frequency signal in the first frequency band is passed and the radio frequency signal in the second frequency band is not passed, the second switch is in a non-conductive state.

6. The multiplexer according to claim 5, wherein when the second switch is in the non-conductive state, a resonant frequency of the second parallel arm circuit is greater than the first frequency band.

7. The multiplexer according to claim 5, wherein the second parallel arm circuit further comprises an inductance element connected to the first parallel arm resonator.

8. A radio frequency circuit, comprising:
the multiplexer according to claim 5; and
a controller configured to control conduction and non-conduction of the first switch and the second switch.

9. A communication device, comprising:
a radio frequency signal processing circuit configured to process a radio frequency signal to be transmitted or received by an antenna; and
the radio frequency circuit according to claim 8 configured to transfer the radio frequency signal between the antenna and the RF signal processing circuit.

10. A radio frequency circuit, comprising:
the multiplexer according to claim 1; and
a controller configured to control conduction and non-conduction of the first switch.

11. A communication device, comprising:
a radio frequency signal processing circuit configured to process a radio frequency signal to be transmitted or received by an antenna; and
the radio frequency circuit according to claim 10 configured to transfer the radio frequency signal between the antenna and the RF signal processing circuit.

12. A multiplexer, comprising:
a common terminal, a first input/output terminal, and a second input/output terminal;
a first filter arranged between the common terminal and the first input/output terminal and configured to selectively pass a radio frequency signal in a first frequency band; and
a second filter arranged between the common terminal and the second input/output terminal and configured to selectively pass a radio frequency signal in a second frequency band, wherein the first filter comprises:
- a first series arm circuit connected between the common terminal and the first input/output terminal;
- a first parallel arm circuit connected between ground and a first node on a first path, the first path connecting the common terminal and the first input/output terminal; and
- a second parallel arm circuit connected between ground and a second node on the first path, wherein the second parallel arm circuit comprises:
- a first parallel arm resonator connected between the second node and ground, the first parallel arm resonator being an acoustic wave resonator; and
- a second switch connected between the first parallel arm resonator and ground, wherein, when the radio frequency signal in the first frequency band and the second frequency band are passed simultaneously, the second switch is in a conductive state, and wherein, when the radio frequency signal in the first frequency band is passed and the radio frequency signal in the second frequency band is not passed, the second switch is in a non-conductive state.

13. The multiplexer according to claim 12, wherein when the second switch is in the non-conductive state, a resonant frequency of the second parallel arm circuit is greater than the first frequency band.

14. The multiplexer according to claim 12, wherein the second parallel arm circuit further comprises an inductance element connected to the first parallel arm resonator.

15. A radio frequency circuit, comprising:
- the multiplexer according to claim 12; and
- a controller configured to selectively control conduction and non-conduction of the second switch.

16. A communication device, comprising:
- a radio frequency signal processing circuit configured to process a radio frequency signal to be transmitted or received by an antenna; and
- the radio frequency circuit according to claim 15 configured to transfer the radio frequency signal between the antenna and the RF signal processing circuit.

\* \* \* \* \*

UNITED STATES PATENT AND TRADEMARK OFFICE
CERTIFICATE OF CORRECTION

PATENT NO.         : 11,264,971 B2
APPLICATION NO.    : 16/683768
DATED              : March 1, 2022
INVENTOR(S)        : Hirotsugu Mori It is certified that error appears in the above-identified patent and that said Letters Patent is hereby corrected as shown below:

In the Specification

Column 14, Line 10, "circuit (parallel" should be -- circuit 42 (parallel --.

Column 23, Line 25, "capacitor CIA" should be -- capacitor C1A --.

Column 25, Line 13, "capacitor CIA." should be -- capacitor C1A. --.

Column 28, Line 22, "capacitor CIA." should be -- capacitor C1A. --.

Column 36, Line 26, "capacitor CIA." should be -- capacitor C1A. --.

Signed and Sealed this
Thirteenth Day of September, 2022

Katherine Kelly Vidal
*Director of the United States Patent and Trademark Office*